United States Patent
Kim et al.

(10) Patent No.: US 11,145,675 B2
(45) Date of Patent: Oct. 12, 2021

(54) SEMICONDUCTOR DEVICE AND MANUFACTURING METHOD OF THE SEMICONDUCTOR DEVICE

(71) Applicant: SK hynix Inc., Icheon-si (KR)

(72) Inventors: Yung Jun Kim, Seoul (KR); Won Hyo Cha, Cheongju-si (KR); Byung Soo Park, Suwon-si (KR); Sang Tae Ahn, Seoul (KR); Sung Jae Chung, Seoul (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/875,657

(22) Filed: May 15, 2020

(65) Prior Publication Data

US 2020/0279865 A1    Sep. 3, 2020

Related U.S. Application Data

(63) Continuation of application No. 16/170,796, filed on Oct. 25, 2018, now Pat. No. 10,692,885.

(30) Foreign Application Priority Data

Mar. 16, 2018  (KR) .................. 10-2018-0031092

(51) Int. Cl.
| | | |
|---|---|---|
| *H01L 27/11582* | (2017.01) | |
| *H01L 29/06* | (2006.01) | |
| *H01L 29/49* | (2006.01) | |
| *H01L 27/11524* | (2017.01) | |
| *H01L 27/11556* | (2017.01) | |
| *H01L 27/1157* | (2017.01) | |
| *H01L 27/11573* | (2017.01) | |
| *H01L 27/11526* | (2017.01) | |
| *H01L 21/265* | (2006.01) | |
| *H01L 21/266* | (2006.01) | |

(52) U.S. Cl.
CPC .... *H01L 27/11582* (2013.01); *H01L 27/1157* (2013.01); *H01L 27/11524* (2013.01); *H01L 27/11526* (2013.01); *H01L 27/11556* (2013.01); *H01L 27/11573* (2013.01); *H01L 29/0649* (2013.01); *H01L 29/4916* (2013.01); *H01L 21/266* (2013.01); *H01L 21/26513* (2013.01)

(58) Field of Classification Search
CPC ......... H01L 27/11582; H01L 27/11524; H01L 27/11526; H01L 27/11556; H01L 27/1157; H01L 27/11573; H01L 29/0649; H01L 29/4916; H01L 21/26513; H01L 21/266

See application file for complete search history.

(56) References Cited

U.S. PATENT DOCUMENTS 8,405,141 B2 * 3/2013 Matsuda ........... H01L 27/11573
                                                            257/324
9,461,063 B1 * 10/2016 Lai ................... H01L 27/11582
(Continued)

FOREIGN PATENT DOCUMENTS

KR    1020140062636 A    5/2014

*Primary Examiner* — Mark W Tornow
(74) *Attorney, Agent, or Firm* — William Park & Associates Ltd.

(57) ABSTRACT

A semiconductor device includes stack structures each including a first conductive layer, a substrate disposed under the stack structures, first impurity regions disposed in the substrate, and at least one trench passing through the stack structures and disposed above the first impurity regions.

20 Claims, 21 Drawing Sheets

(56) References Cited

U.S. PATENT DOCUMENTS

| | | | |
|---|---|---|---|
| 9,679,910 B2* | 6/2017 | Nomura | H01L 27/11582 |
| 2012/0061743 A1* | 3/2012 | Watanabe | H01L 27/11582 257/324 |

* cited by examiner

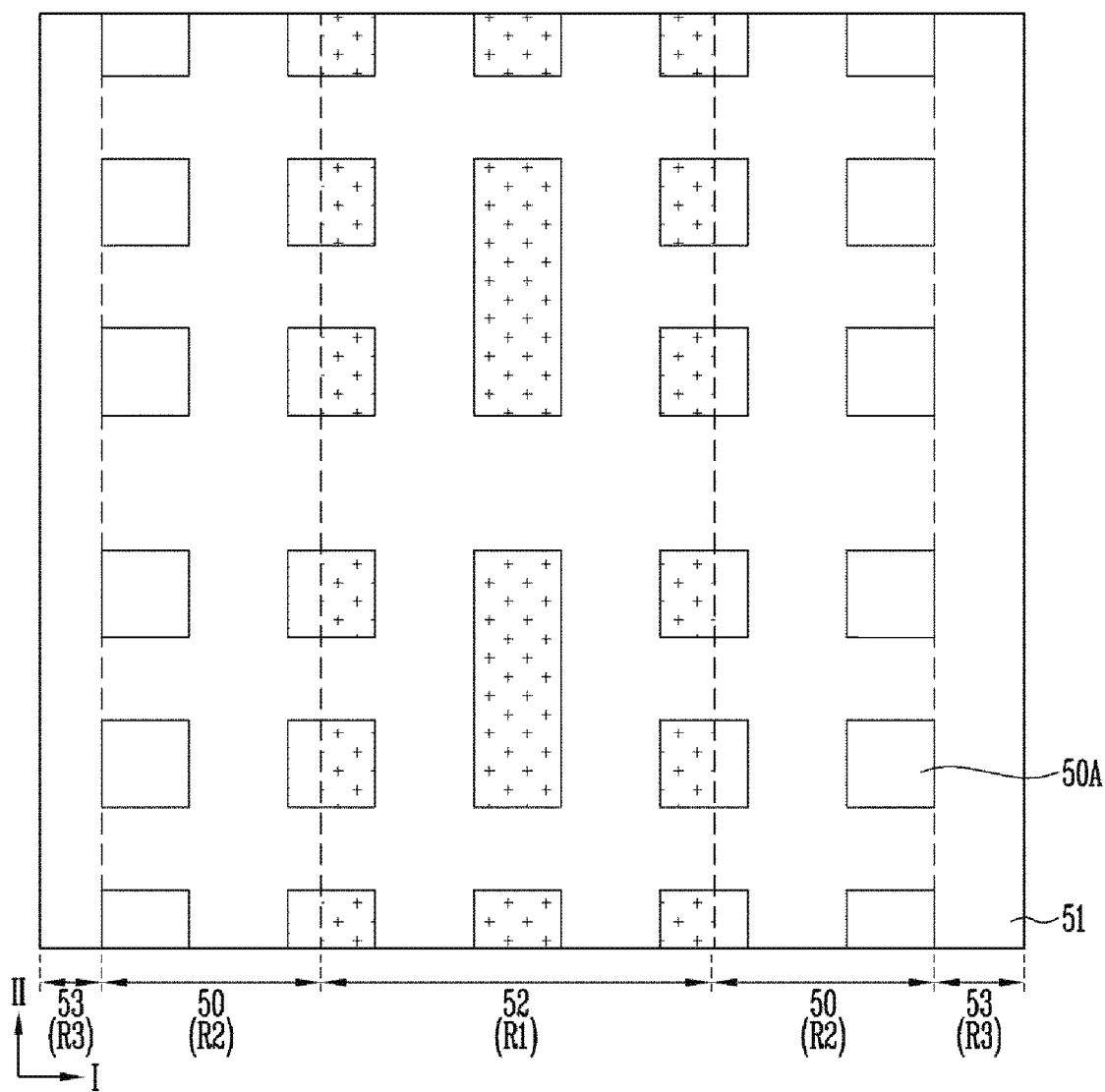

SEMICONDUCTOR DEVICE AND MANUFACTURING METHOD OF THE SEMICONDUCTOR DEVICE

CROSS-REFERENCE TO RELATED APPLICATION

The present application is a continuation application of U.S. patent application Ser. No. 16/170,796, filed on Oct. 25, 2018, and claims priority under 35 U.S.C. § 119(a) to Korean patent application number 10-2018-0031092, filed on Mar. 16, 2018, in the Korean Intellectual Property Office, the entire disclosure of which is incorporated herein by reference.

BACKGROUND

1. Technical Field

Various embodiments generally relate to an electronic device, and more particularly, to a semiconductor device and a manufacturing method thereof.

2. Related Art

Non-volatile memory devices retain stored data regardless of power on/off conditions. The increase in integration density of two-dimensional non-volatile memory devices in which memory cells are formed in a single layer over a substrate has recently been limited. Thus, three-dimensional non-volatile memory devices have been proposed in which memory cells are stacked in a vertical direction over a substrate.

A three-dimensional non-volatile memory device may include interlayer insulating layers and gate electrodes stacked alternately with each other, and channel layers passing therethrough, and memory cells may be stacked along the channel layers. Various structures and manufacturing methods have been developed to improve the operational reliability of three-dimensional non-volatile memory devices.

SUMMARY

According to an embodiment, a semiconductor device may include stack structures each including a first conductive layer including a first type impurity, a substrate disposed under the stack structures and including a second type impurity different from the first type impurity, first impurity regions disposed in the substrate and including the first type impurity, and at least one trench passing through the stack structures and disposed above the first impurity regions.

According to an embodiment, a semiconductor device may include a first conductive layer including a first type impurity, a stack structure including second conductive layers and first insulating layers disposed on the first conductive layer and alternately stacked on each other, a substrate disposed under the first conductive layer and including an isolation layer and active regions, first impurity regions disposed in the active regions and including the first type impurity, and an insulating structure passing through the stack structure and including an intersection of at least two insulating patterns, wherein the first impurity regions are disposed under the intersection.

According to an embodiment, a method of manufacturing a semiconductor device may include forming a first impurity region of a first type impurity in a substrate, forming a stack structure including a first conductive layer including the first type impurity on the substrate, forming a first opening passing through the stack structure and disposed above the first impurity region, and forming an insulating structure in the first opening, wherein the substrate includes a second type impurity different from the first type impurity.

According to an embodiment, a method of manufacturing a semiconductor device may include forming a first impurity region of a first type impurity in a substrate, forming a first conductive layer including the first type impurity on the substrate, forming a stack structure including first material layers and second material layers disposed on the first conductive layer and alternately stacked on each other, forming a first opening passing through the stack structure and disposed above the first impurity region, and replacing the first material layers with third material patterns through the first opening, wherein the substrate includes a second type impurity different from the first type impurity, and at least one third material pattern and the first impurity region are electrically connected.

According to an embodiment, a semiconductor device may include a stack structure comprising a first conductive layer and second conductive layers alternately stacked with insulating layers disposed on the first conductive layer, a substrate disposed under the stack structure and comprising an isolation layer and active region, an impurity region disposed in the active region, and a trench passing through the stack structure and into the impurity region.

BRIEF DESCRIPTION OF THE DRAWINGS

FIGS. 5A, 6A, 7A, and 8A, FIGS. 5B, 6B, 7B, and 8B, and FIGS. 9 and 10 are diagrams illustrating a method of manufacturing a semiconductor device according to an embodiment;

DETAILED DESCRIPTION

Figure 1A:
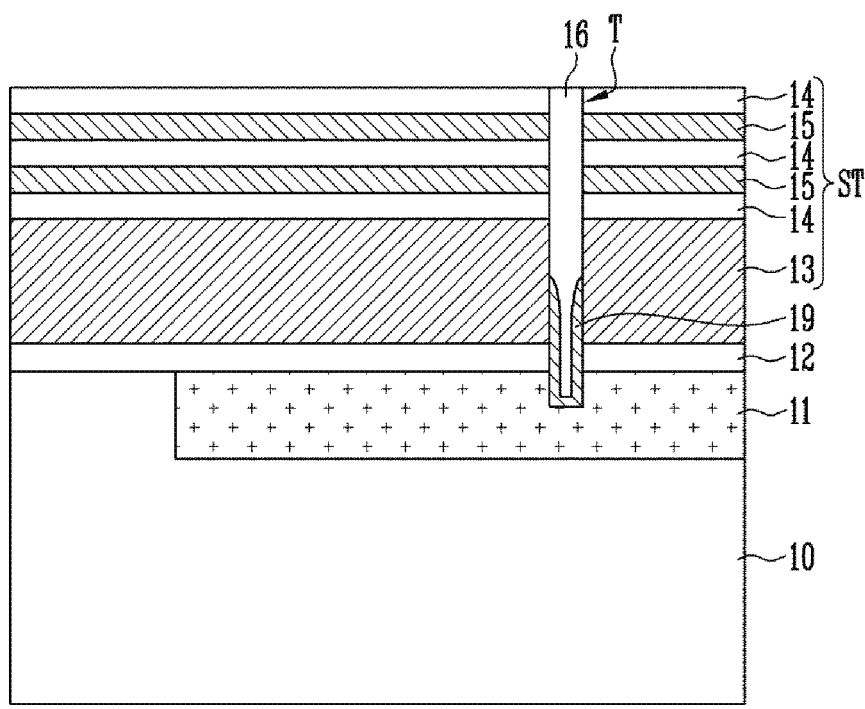
FIGS. 1A to 1E are cross-sectional views illustrating the structure of a semiconductor device according to an embodiment.

Hereinafter, various examples of embodiments will be described with reference to the accompanying drawings. In the drawings, thicknesses and lengths of components may be exaggerated for convenience of illustration. In the following description, a description of related functions and constitutions may be omitted for simplicity and conciseness. Like reference numerals refer to like elements throughout the specification and drawings.

It is also noted that in this specification, "connected/coupled" refers to one component not only directly coupling another component but also indirectly coupling another component through an intermediate component. In the specification, when an element is referred to as "comprising" or "including" a component, it does not exclude other components but may further include other components unless a description to the contrary is specifically pointed out in context.

Various embodiments may be directed to a semiconductor device having a simplified manufacturing process, a stabilized structure, and improved reliability, and a manufacturing method thereof.

FIGS. 1A to 1E are cross-sectional views illustrating the structure of a semiconductor device according to an embodiment.

Referring to FIG. 1A, the semiconductor device according to an embodiment may include a stack structure ST, a substrate 10, a first impurity region 11, and a trench T. In addition, the semiconductor device may further include an insulating structure 16 and a conductive pattern 19 in the trench T, and an interlayer insulating layer 12.

The stack structure ST may include a first conductive layer 13 including a first type impurity. In addition, the stack structure ST may further include second conductive layers 15 and insulating layers 14 alternately stacked on each another. The second conductive layers 15 and the insulating layers 14 may be disposed above the first conductive layer 13. The first and second conductive layers 13 and 15 may include a metal such as tungsten and polysilicon. For example, the first conductive layer 13 may be a polysilicon layer including an impurity and a polysilicon layer including an N-type impurity. The second conductive layers 15 may be polysilicon layers including an impurity and metal layers such as tungsten layers. The insulating layers 14 may insulate the stacked first and second conductive layers 13 and 15 from each other and may include oxides and nitrides.

For example, the first conductive layer 13 may be a pipe gate, at least one uppermost second conductive layer 15 among the second conductive layers 15 may be a selection line, and the rest of the second conductive layers 15 may be word lines. In this example, a memory string may include at least one first select transistor, a plurality of first memory cells, at least one pipe transistor, a plurality of second memory cells, and at least one second select transistor. In addition, the memory string may be arranged in a U-shape or a W-shape on the substrate 10.

In an example, the substrate 10 may be a first substrate and the first conductive layer 13 may be a second substrate including a source region or a source line. In addition, at least one uppermost second conductive layer 15 among the second conductive layers 15 may be a first select line, at least one lowermost second conductive layer 15 among the second conductive layers 15 may be a second select line, and the rest of the second conductive layers 15 may be word lines. In this example, a peripheral circuit may be arranged on the substrate 10, and a cell array may be arranged on the first conductive layer 13. A memory string may include at least one first select transistor, a plurality of memory cells, and at least one second select transistor. In addition, the memory string may be arranged in a straight format above the first conductive layer 13.

The substrate 10 may be disposed under the stack structure ST and may include a second type impurity different from the first type impurity. For example, when a first type impurity is an N-type impurity, a second type impurity may be a P-type impurity, or when a first type impurity is a P-type impurity, a second type impurity may be an N-type impurity. The N-type impurity may include phosphorus (P), arsenic (As), antimony (Sb), etc. The P-type impurity may include indium (In), aluminum (Al), boron (B), etc.

The first impurity regions 11 may be disposed in the substrate 10 and may include the first type impurity. The first impurity regions 11 may include the same impurity as the first conductive layer 13 and a different impurity from the substrate 10. For example, the substrate 10 may be a semiconductor substrate of a P-type, the first conductive layer 13 may be a polysilicon layer of an N-type, and the first impurity regions 11 may include an N-type impurity. Accordingly, a PN junction may be formed at a boundary between the substrate 10 and the first impurity regions 11.

The trench T may pass through the stack structure ST and may be disposed above the first impurity region 11. The trench T may pass through the stack structure ST in a stacking direction to have a depth which may expose the interlayer insulating layer 12 at least, and may extend to the first impurity region 11. For example, the trench T may pass through the stack structure ST and the interlayer insulating layer 12 and may have a depth which may expose the first impurity region 11. In this example, a bottom surface of the trench T may be disposed on a higher level than a bottom surface of the first impurity region 11.

The insulating structure 16 may be disposed in the trench T. In addition, the conductive pattern 19 may be disposed at a lower portion of the trench T. The conductive pattern 19 may include a metal material and the same materials as the second conductive layers 15.

The conductive pattern 19 may remain during a process of replacing sacrificial layers included in the stack structure ST with the second conductive layers 15. The conductive pattern 19 may remain at the lower portion of the trench T and may couple at least one of the first and second conductive layers 13 and 15 to the first impurity region 11. For example, the first conductive layer 13 and the first impurity region 11 may be electrically connected by the conductive pattern 19.

The conductive pattern 19 may provide an inadvertent current path between the first conductive layer 13 and the substrate 10. In other words, when bias is applied to the first conductive layer 13, a current may flow from the first conductive layer 13 to the substrate 10 through the conductive pattern 19. Thereby, the current may be lost and a memory device may not operate properly. However, when the first impurity regions 11 exist in the substrate 10, a flow of a current may be blocked by a depletion region.

As described above, when the substrate 10 and the first impurity regions 11 include different type impurities from each other, the PN junction may be formed at the boundary between the substrate 10 and the first impurity regions 11. In addition, when the bias is applied to the first conductive layer 13, since the bias may be transferred to the first impurity region 11 through the conductive pattern 19, reverse bias may be applied to the PN junction. Accordingly, the depletion region may be formed at the boundary between the substrate 10 and the first impurity regions 11, and the current may be prevented from flowing from the first conductive layer 13 to the substrate 10. In other words, even if the conductive pattern 19 remains in the trench T, and the first conductive layer 13 and the substrate 10 are coupled by the conductive pattern 19, current loss may be prevented.

Figure 1B:
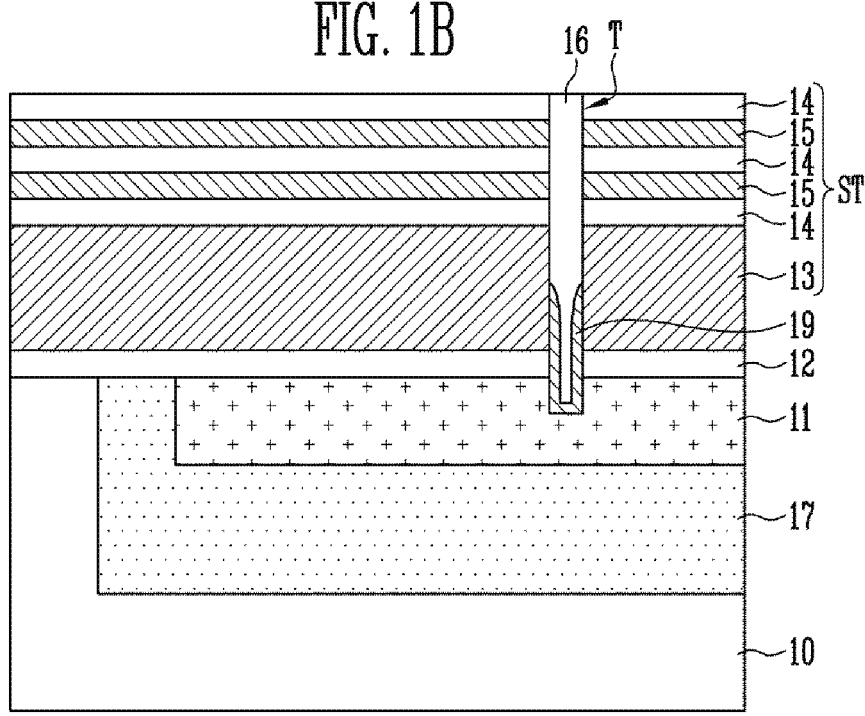

Referring to FIG. 1B, a semiconductor device may have a similar structure to the semiconductor device as described with reference to FIG. 1A and may further include a second impurity region 17. The second impurity region 17 may include the second type impurity which is different from the first type impurity, and may include an impurity of which a type is the same as the substrate 10. For example, the substrate 10 and the second impurity region 17 may include P-type impurities, and the first impurity region 11 may include N-type impurities. In this example, the second impurity region 17 may include the second type impurity at a higher concentration than the substrate 10. According to this structure, a PN junction may be formed at a boundary between the first impurity region 11 and the second impurity region 17.

Figure 1C:
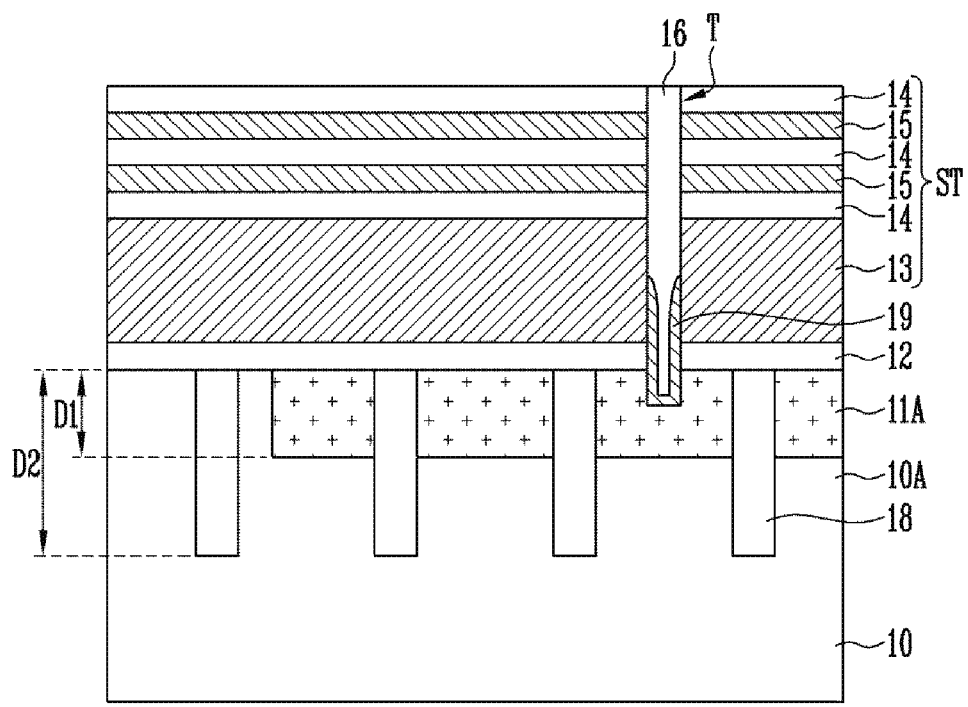

Referring to FIG. 1C, a semiconductor device may have a similar structure to the semiconductor device as described with reference to FIG. 1A and may further include an isolation layer 18. The isolation layer 18 may be formed in the substrate 10 and active regions 10A may be defined by the isolation layer 18. A height of each of the active regions 10A may be determined by a depth of each of the isolation layers 18.

A first impurity region 11A may be formed in the active region 10A. In addition, the first impurity region 11A may be formed in some regions of the active region 10A. For example, the first impurity region 11A may be formed at an upper portion of the active region 10A. In this example, the first impurity region 11A may have a smaller depth than the isolation layer 18 (D1<D2). In an embodiment, the first impurity region 11A may have a depth D1 less than a depth D2 of the isolation layer D2. Each pair of the first impurity regions 11A neighboring each other may be separated from each other by each of the isolation layers 18. In an embodiment, first impurity regions 11A neighboring each other may be separated from each other by an isolation layer 18 located between the neighboring first impurity regions 11A.

In addition, the trench T may be disposed above the active region 10A. Accordingly, the isolation layer 18 may not be exposed during an etching process of forming the trench T. The active region 10A may function as an etch stop layer. In an embodiment, the trench T may be disposed above one active region 10A, the active region 10A located between neighboring isolation layers 18.

Figure 1D:
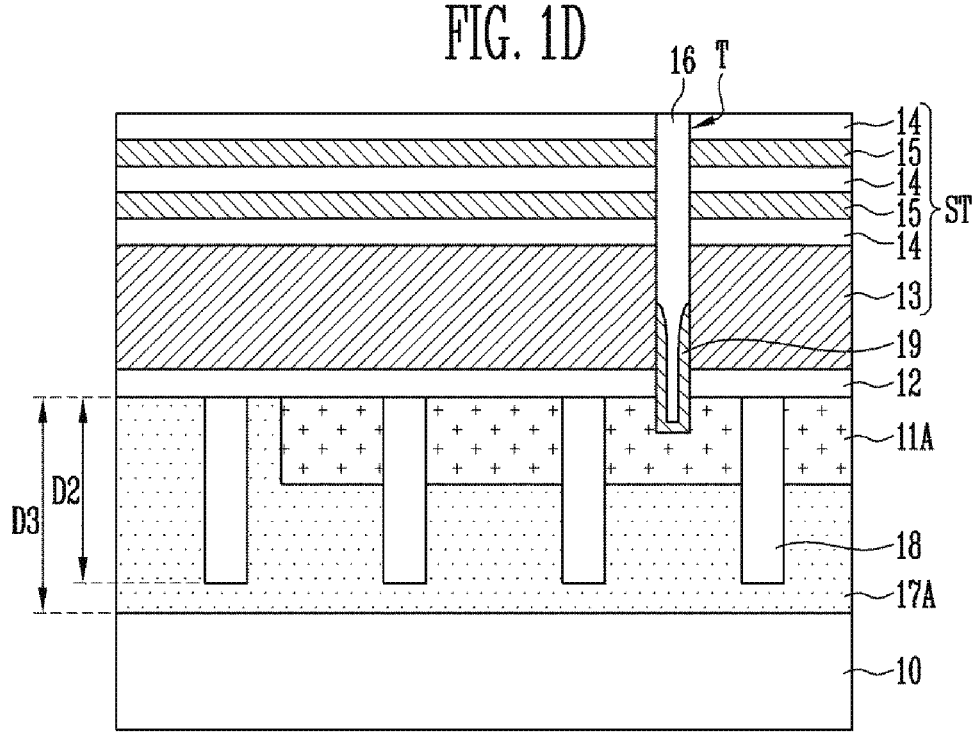

Referring to FIG. 1D, a semiconductor device may have a similar structure to the semiconductor device as described with reference to FIG. 1A and may further include a second impurity region 17A. The second impurity region 17A may be formed in the substrate 10. The second impurity region 17A may have a larger depth than the first impurity region 11A and the first impurity region 11A may be disposed in the second impurity region 17A. In addition, the second impurity region 17A may have a larger depth than the isolation layer 18 (D3>D2). In an embodiment, the depth D2 of the isolation layer 18 may be less than the depth D3 of the second impurity region 17A.

The second impurity region 17A may include the second type impurity different from the first type impurity, and may include an impurity of which a type is the same as the substrate 10. Accordingly, a PN junction may be formed at a boundary between the second impurity region 17A and the first impurity region 11A.

Figure 1E:
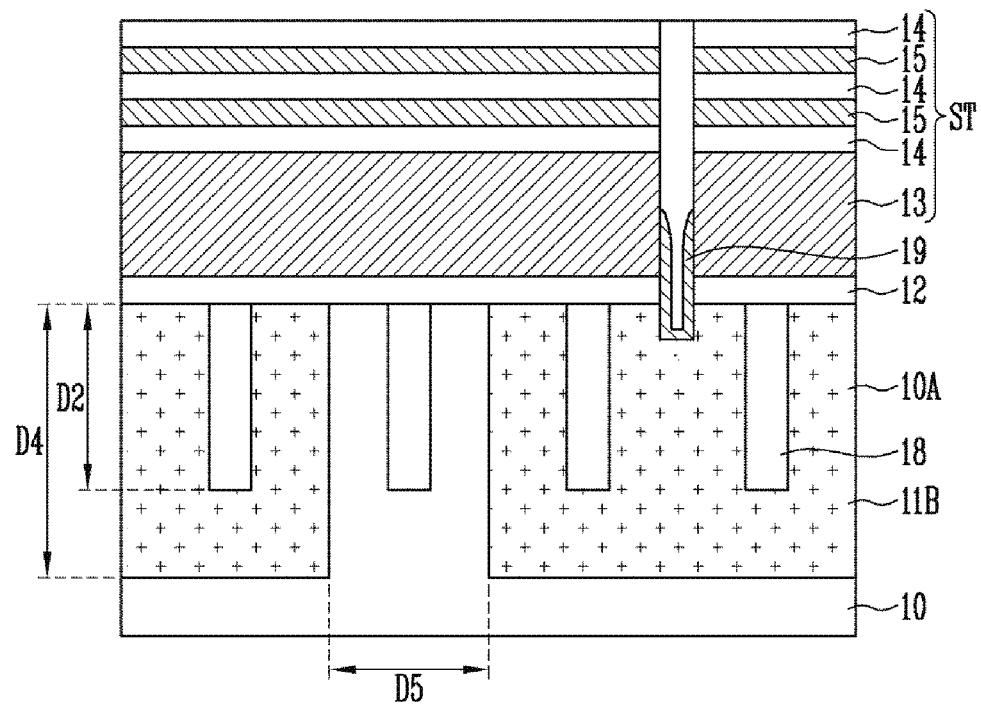

Referring to FIG. 1E, a semiconductor device may have a similar structure to the semiconductor device as described with reference to FIG. 1C, and each of first impurity regions 11B may have a larger depth D4 than a depth D2 of each of the isolation layers 18 (D4>D2). Each of the first impurity regions 11B may surround each of the isolation layers 18. For example, during a process of doping the first type impurity to the substrate 10, the depth D4 of each of the first impurity regions 11B may be controlled by controlling an injection depth of an impurity.

The first impurity region 11B may be formed in some regions of the active region 10A. Accordingly, each pair of the first impurity regions 11B neighboring each other may be spaced apart from each other to be arranged at a distance of a predetermined distance (D5). When the first impurity regions 11B neighboring each other are included in different memory blocks, respectively, the distance (D5) may be controlled so that each of the memory blocks is individually driven. For example, the first impurity regions 11B neighboring each other may be spaced apart from each other at a sufficient distance (D5) so as to secure a breakdown voltage.

The above-described embodiments may be combined with one another. For example, the semiconductor device of FIG. 1E may further include the second impurity region so that the first impurity region 11B is located in the second impurity region (please refer to FIG. 1D).

Figure 2A:
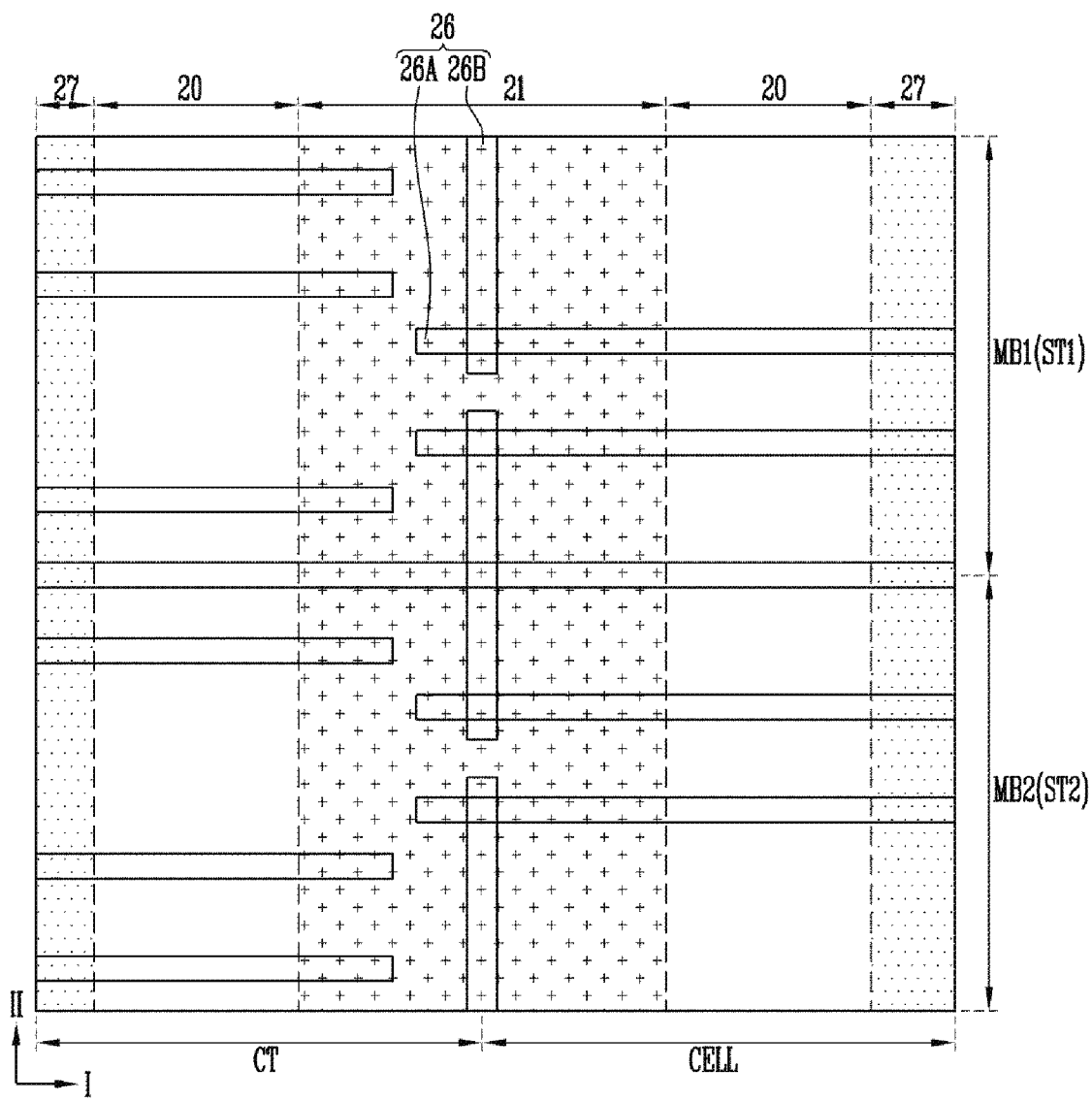
FIGS. 2A and 2B are layout views illustrating the structure of a semiconductor device according to an embodiment.
Figure 2B:
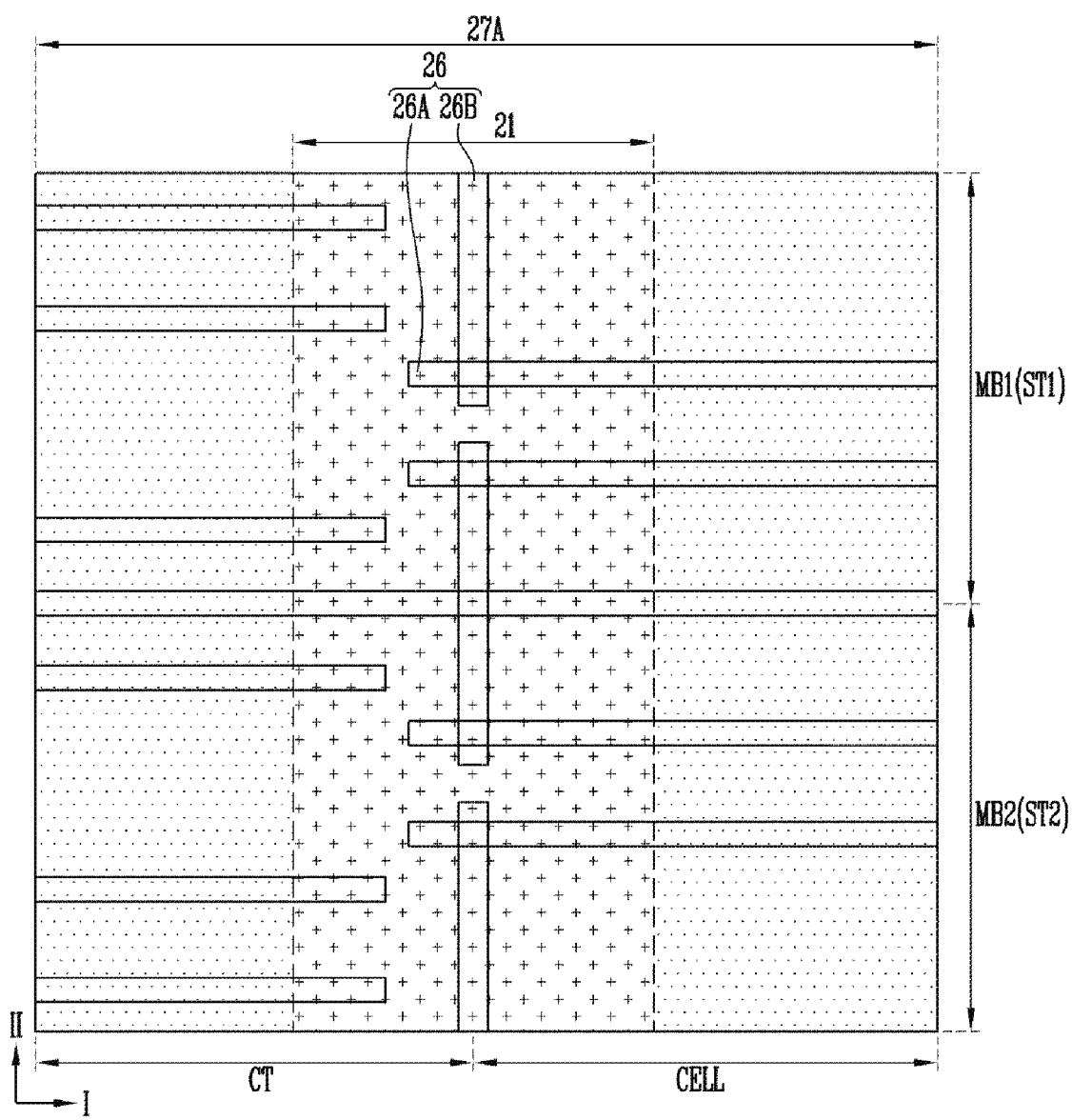

FIGS. 2A and 2B are layout views illustrating the structure of a semiconductor device according to an embodiment.

Referring to FIGS. 2A and 2B, the semiconductor device according to an embodiment may include a plurality of memory blocks MB1 and MB2. Each of the memory blocks MB1 and MB2 may be a unit of an operation, for example, a unit of an erase operation. Accordingly, each pair of the memory blocks MB1 and MB2 neighboring each other may be electrically separated from each other. For example, a first stack structure ST1 included in the first memory block MB1 and a second stack structure ST2 included in the second memory block MB2 may be electrically separated from each other.

Each of the stack structures ST1 and ST2 may include a cell region CELL and a contact region CT. The memory strings may be disposed in the cell region CELL. Each of the memory strings may include the memory cells which are stacked. An interconnection structure for applying bias to each of the conductive layers included in the stack structures ST1 and ST2 may be disposed in the contact region CT. For example, the contact region CT of each of the stack structures ST1 and ST2 may have a step shape, and the interconnection structure of a contact plug, a wire, etc., may be coupled to each of the conductive layers of each level.

The semiconductor device may include a first impurity region 21 in a substrate 20. The first impurity region 21 may include a first type impurity different from a second type impurity included in the substrate 20. The first impurity region 21 may be disposed at a boundary between the cell region CELL and the contact region CT. In addition, the first impurity region 21 may extend to the cell region CELL and the contact region CT. The first impurity region 21 may be formed at a region in the cell region CELL adjacent to the contact region CT and at a region in the contact region CT adjacent to the cell region CELL.

The semiconductor device may further include second impurity regions 27 and 27A in the substrate 20. The second impurity regions 27 and 27A may include the second type impurity different from the first type impurity included in the first impurity region 21. The second impurity regions 27 and 27A may include the second type impurity at a higher concentration than the substrates 10 and 20. In addition, positions of the second impurity regions 27 and 27A may be variously changed.

Referring to FIG. 2A, the second impurity region 27 may be spaced apart from the first impurity region 21. As described above with reference to FIGS. 1A, 1C, and 1E, the first impurity regions 11, 11A, 11B, and 21 may be disposed in the substrates 10 and 20, and the PN junction may be formed at the boundary between the second type substrates 10 and 20 and the first impurity regions 11, 11A, 11B, and 21 of a first type. Accordingly, the breakdown voltage may be secured by differences in concentrations of impurities between the first impurity regions 11, 11A, 11B, and 21 and the substrates 10 and 20. In addition, it is more advantageous to secure the breakdown voltage when the differences in concentrations of impurities become greater.

Referring to FIG. 2B, the second impurity region 27A may be disposed to contact the first impurity region 21. As described above with reference to FIGS. 1B and 1D, the first impurity regions 11, 11A, and 21 may be disposed in the second impurity regions 17, 17A, and 27A. In addition, the PN junction may be formed at the boundary between the second impurity regions 17, 17A, and 27A and the first impurity regions 11, 11A, and 21.

The semiconductor device may further include insulating structures 26 passing through the stack structures ST1 and ST2. Each of the insulating structures 26 may include at least two insulating patterns 26A and 26B crossing each other. For example, each of the insulating structures 26 may include at least one first insulating pattern 26A and at least one second insulating pattern 26B. In addition, intersections of the first insulating pattern 26A and the second insulating pattern 26B may be disposed at the boundary between the cell region CELL and the contact region CT.

The first insulating patterns 26A may extend in a first direction I and the second insulating patterns 26B may extend in a second direction II intersecting the first direction I. For example, a portion of the first insulating patterns 26A may be disposed at a boundary between the memory blocks MB1 and MB2 neighboring each other, and may be longer than the remaining first insulating patterns 26A. The first insulating patterns 26A in the cell region CELL may be arranged in parallel to one another, and the first insulating patterns 26A in the contact region CT may be arranged in parallel to one another. In addition, the first insulating patterns 26A in the cell region CELL and the first insulating patterns 26A in the contact region CT may be collinearly arranged or alternately arranged in the second direction II.

Each of the insulating structures 26 may have a different depth according to regions. For example, intersections where the first insulating patterns 26A and the second insulating patterns 26B cross each other may be deeper than a non-intersection region where the first insulating patterns 26A and the second insulating patterns 26B do not cross each other. The differences in depths between the intersections and the non-intersections may be caused by a method of forming the insulating structures 26. When the first insulating pattern 26A and the second insulating pattern 26B are formed with separate processes, since etching processes are performed repeatedly at the intersections of the first and second insulating patterns 26A and 26B, the intersections may be etched deeper than the non-intersections. In other words, a possibility that a punch occurs may become high. Accordingly, in an embodiment, the intersections and the first impurity region 21 may be arranged to overlap each other. In other words, the first impurity region 21 may be arranged under the intersection region. Even though a punch occurs, current loss may be prevented by a depletion region by arranging the first impurity region 21 at a region having the high possibility that the punch occurs.

Figure 3A:
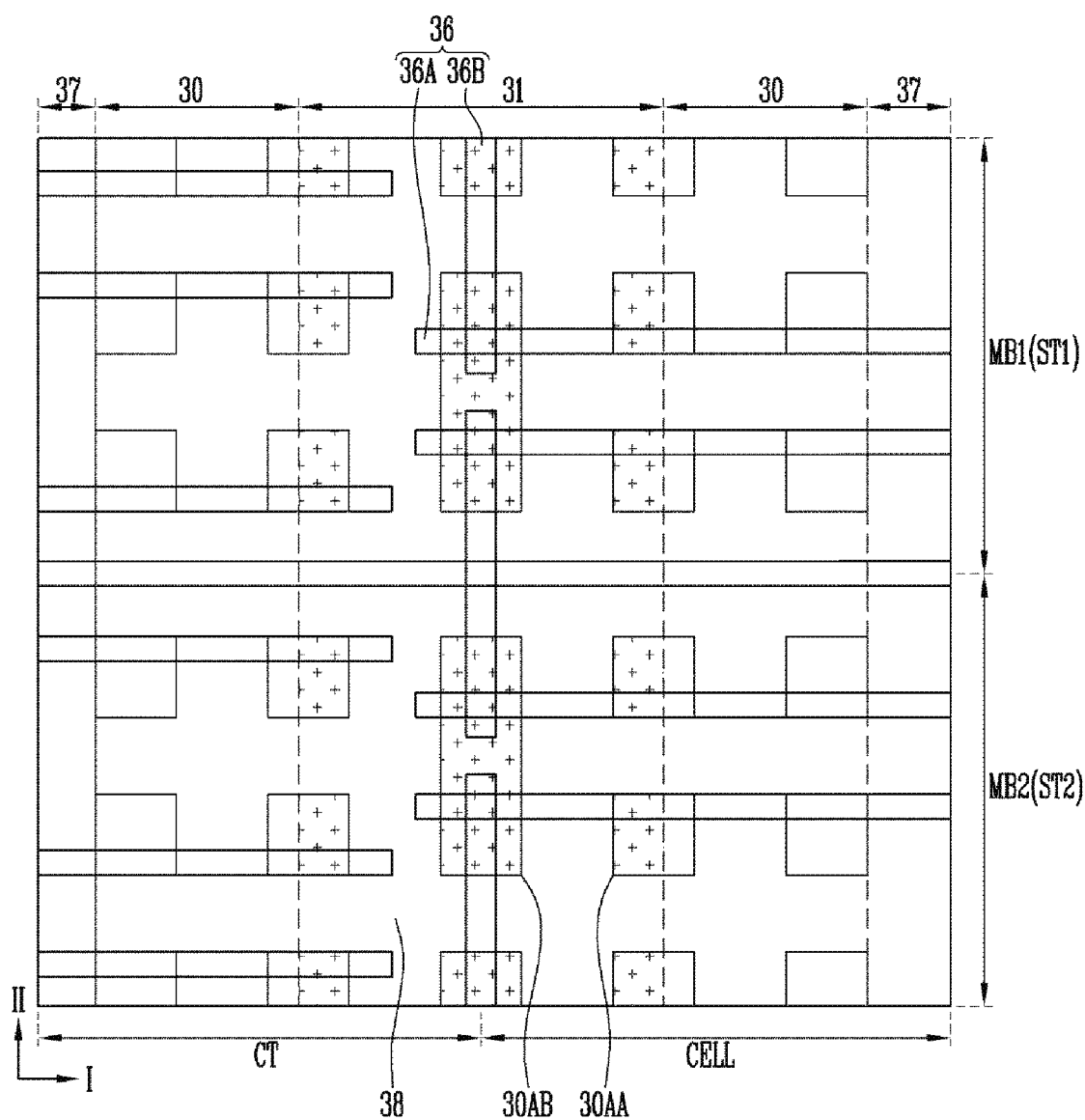
FIGS. 3A and 3B are layout views illustrating the structure of a semiconductor device according to an embodiment.
Figure 3B:
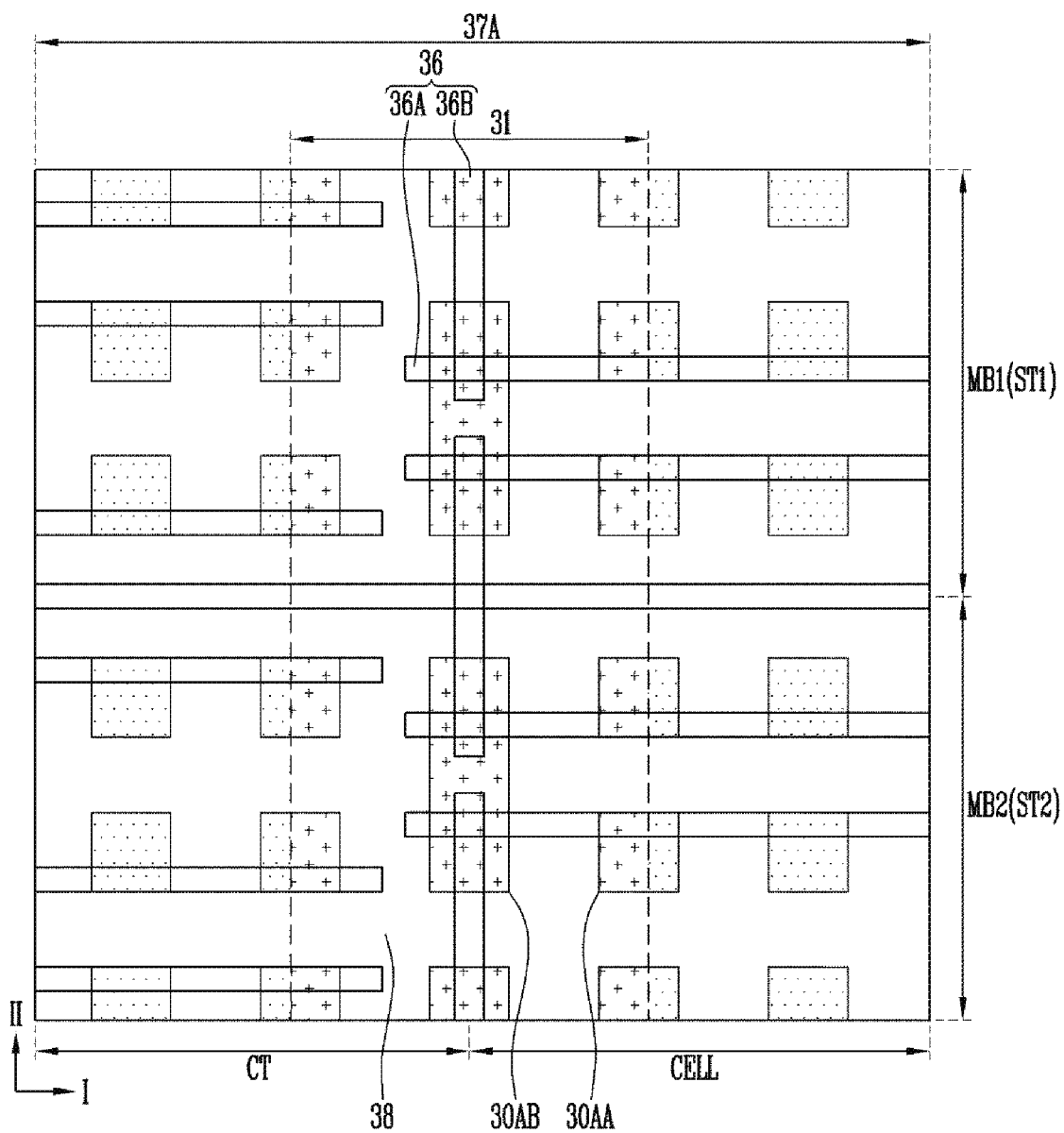

FIGS. 3A and 3B are layout views illustrating the structure of a semiconductor device according to an embodiment. Hereinafter, relative positions of an isolation layer, an active region, an insulating structure, and first and second impurity regions with reference to FIGS. 3A and 3B, and any repetitive description of components already mentioned above will be omitted.

Referring to FIGS. 3A and 3B, the semiconductor device according to an embodiment may include an isolation layer 38 and active regions 30AA and 30AB in a substrate 30. The active regions 30AA and 30AB may be disposed in the cell region CELL, in the contact region CT, at a boundary between the cell region CELL and the contact region CT, etc., and may have various shapes. For example, the active regions 30AB disposed at the boundary between the cell region CELL and the contact region CT may have a relatively greater area than the active regions 30AA disposed in the contact region CT or in the cell region CELL.

In addition, shapes and positions of the isolation layer 38 and the active regions 30AA and 30AB may be determined by considering a breakdown voltage to operate the memory blocks MB1 and MB2 separately. For example, the isolation layer 38 may be disposed at the boundary between the first memory block MB1 and the second memory block MB2. In addition, a width of the isolation layer 38 may be determined so that the active regions 30AA and 30AB of the first memory block MB1 and the active regions 30AA and 30AB of the second memory block MB2 may be sufficiently spaced apart from each other. Thus, the breakdown voltage may be secured and the memory blocks MB1 and MB2 may be separately operated.

At least a portion of the active regions 30AA and 30AB may include a first impurity region 31. For example, the active regions 30AA and 30AB which are disposed at the boundary between the cell region CELL and the contact region CT or disposed adjacent to the boundary between the cell region CELL and the contact region CT may include the first impurity region 31. In this example, as described above with reference to FIGS. 1C to 1E, the first impurity regions 11A, 11B, 31 may be formed in some region of the active regions 30AA, 30AB and 10A or at the entirety of the active regions 30AA, 30AB and 10A.

The semiconductor device may further include second impurity regions 37 and 37A in the substrate 30. Positions of the second impurity regions 37 and 37A may be variously changed. Referring to FIG. 3A, the second impurity region 37 may be spaced apart from the first impurity region 31. As described above with reference to FIGS. 1A, 1C, and 1E, the first impurity regions 11, 11A, 11B, and 31 may be disposed in the substrates 10 and 30 and a PN junction may be formed at a boundary between the second type substrates 10 and 30 and the first impurity regions 11, 11A, 11B, and 31. Accordingly, a breakdown voltage may be secured. Referring to FIG. 3B, the second impurity region 37A may be disposed to contact the first impurity region 31. As described above with reference to FIGS. 1B and 1D, the first impurity regions 11, 11A, and 31 may be disposed in the second impurity regions 17, 17A, and 37A. In addition, a PN junction may be formed at a boundary between the second impurity regions 17, 17A, and 37A and the first impurity regions 11, 11A, and 31.

For reference, a region to which the first type impurity is doped is denoted by the reference numeral "31" and a region to which the second type impurity is doped is denoted by the reference numerals "37" or "37A" in FIGS. 3A and 3B. When the isolation layer 38 is formed in the substrate 30, since impurities may be doped not only to the active regions 30AA and 30AB but also to the isolation layer 38, the isolation layer 38 disposed in the first impurity region 31 or the second impurity regions 37 and 37A may include the impurities. In this regard, impurity regions in the active regions 30AA and 30AB may function as substantial impurity regions.

The semiconductor device may include an insulating structure 36 including at least one first insulating pattern 36A and at least one second insulating pattern 36B. In addition, intersections of the first insulating pattern 36A and the second insulating pattern 36B may be disposed to overlap the active regions 30AA and 30AB. Accordingly, the active region 30AB disposed under the intersections may serve as an etch stop layer during a process of forming the insulating structure 36.

Figure 4A:
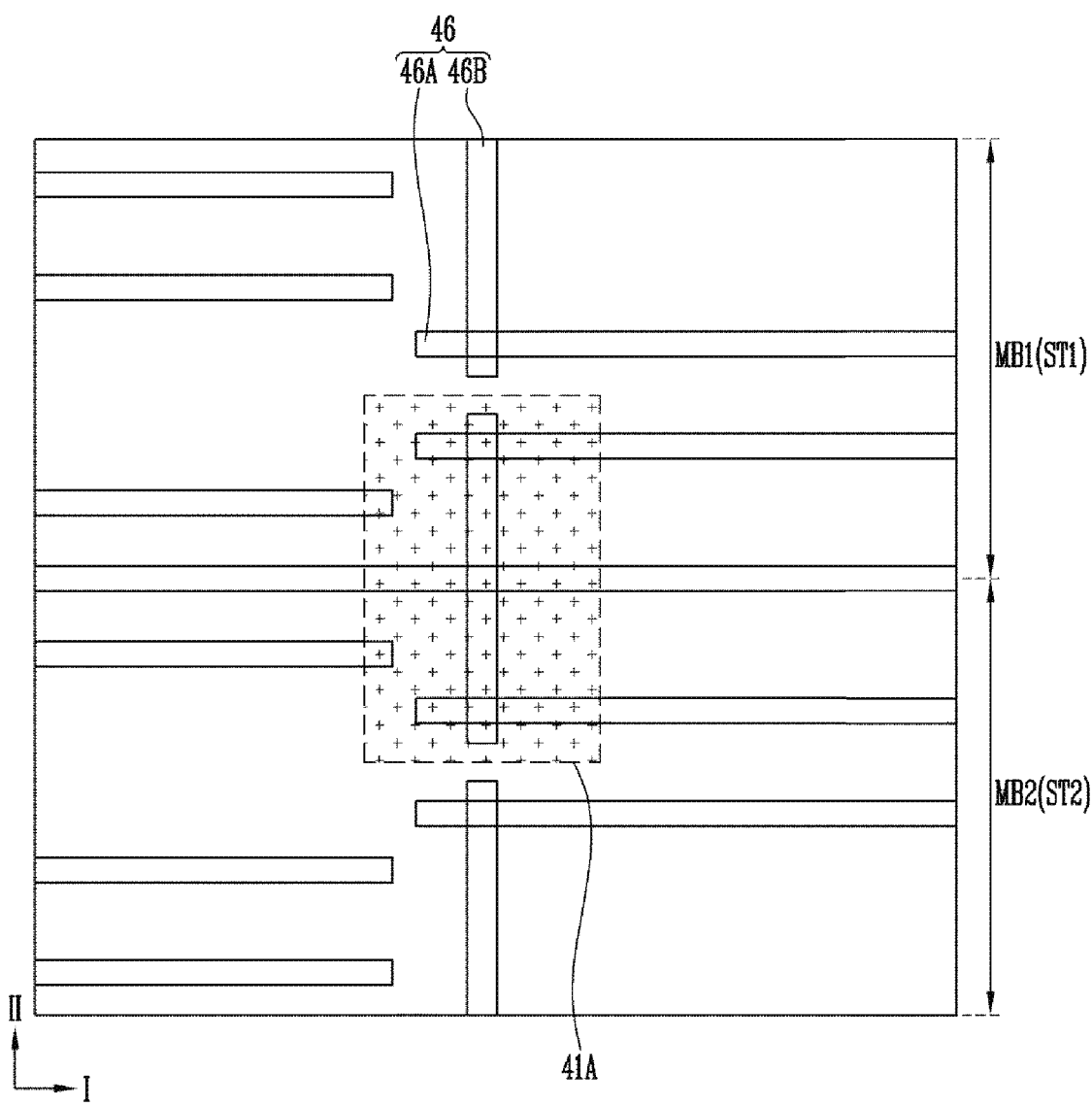
FIGS. 4A to 4C are layout views illustrating the structure of a semiconductor device according to an embodiment.
Figure 4B:
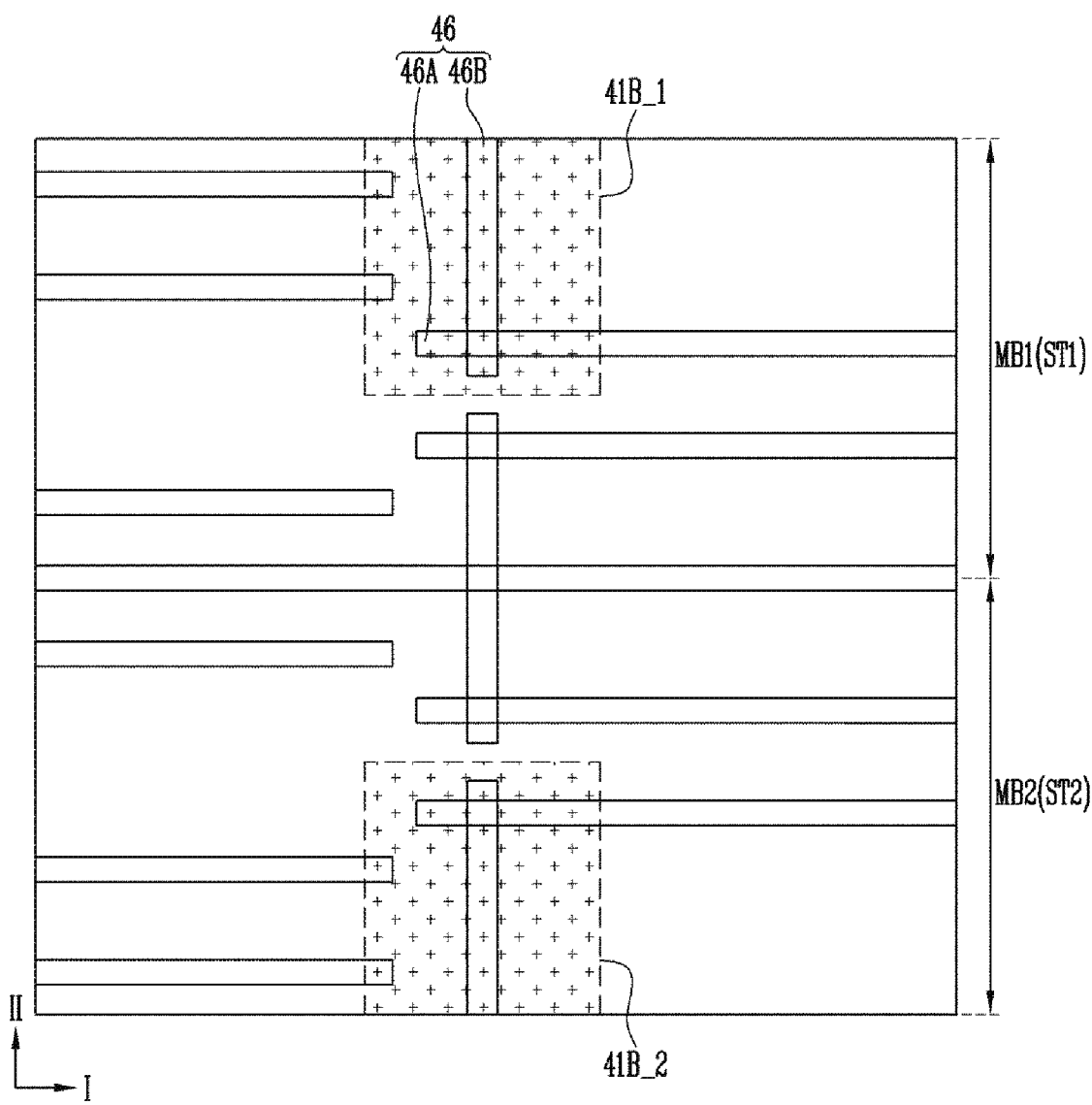
Figure 4C:
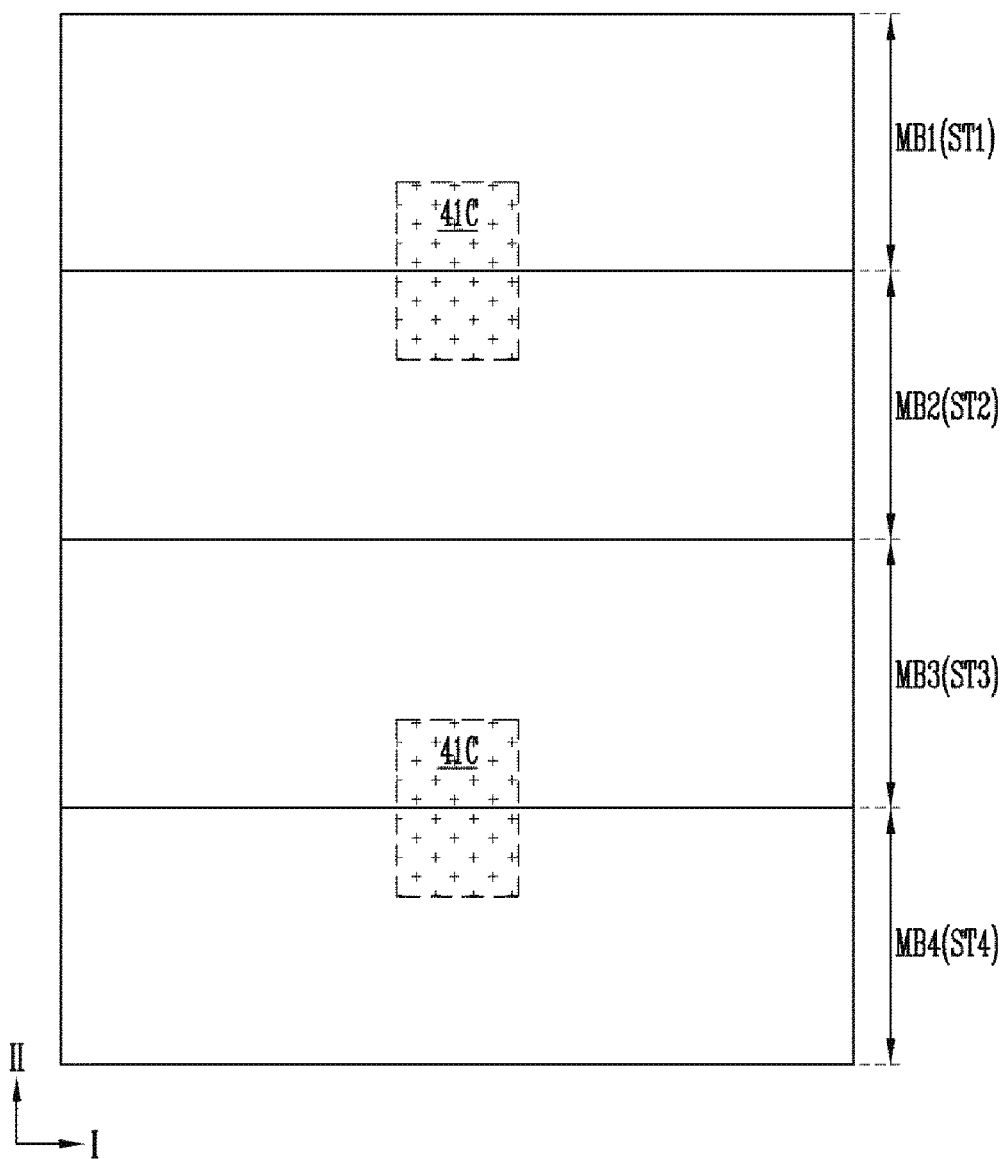

FIGS. 4A to 4C are layout views illustrating the structure of a semiconductor device according to an embodiment. Hereinafter, positions of first impurity regions disposed in a plurality of memory blocks, and any repetitive description of components already mentioned above will be omitted.

Referring to FIGS. 4A and 4B, the semiconductor device may include first impurity regions 41A, 41B_1, and 41B_2, the stack structures ST1 and ST2, and an insulating structure 46. The first impurity regions 41A, 41B_1, and 41B_2 may be disposed in memory blocks MB1, MB2, MB3, and MB4 or, at the boundary between the memory blocks MB1 and MB2 neighboring each other. In addition, the first impurity regions 41A, 41B_1, and 41B_2 may be disposed under a structure which is vulnerable to a punch. For example, the first impurity regions 41A, 41B_1, and 41B_2 may be disposed under intersections of the first insulating pattern 46A and a second insulating pattern 46B.

Referring to FIG. 4A, the memory blocks MB1 and MB2 neighboring each other may share the first impurity region 41A. For example, when the plurality of memory blocks MB1 and MB2 included in the semiconductor device are separately driven by being divided into the odd memory blocks MB1 and the even memory blocks MB2, the first memory block MB1 and the second memory block MB2 neighboring each other may not be driven at the same time. Accordingly, although the first memory block MB1 and the second memory block MB2 neighboring each other share the first impurity region 41A, the memory blocks may be separately driven. Each of the first impurity regions 41A may be disposed at each boundary between the memory blocks MB1 and MB2 neighboring each other.

Referring to FIG. 4B, the first impurity regions 41B_1 and 41B_2 may be formed to correspond to the memory blocks MB1 and MB2, respectively. The first impurity region may not be disposed at the boundary between the memory blocks MB1 and MB2 neighboring each other. The first impurity regions 41B_1 and 41B_2 may be disposed in the memory blocks MB1 and MB2, respectively. Accordingly, the first impurity regions 41B_1 and 41B_2 included in each of the memory blocks MB1 and MB2 may be spaced apart from each other. For example, the first impurity region 41B_1 may be disposed in the first memory block MB1, and the first impurity region 41B_2 may be disposed in the second memory block MB2. The first impurity region 41B_1 and the first impurity region 41B_2 may be spaced apart from each other at a sufficient distance so as to secure a breakdown voltage.

Referring to FIG. 4C, each pair of the memory blocks MB1, MB2, MB3, and MB4 neighboring each other may share a first impurity region 41C, and the first impurity region 41C may be disposed only at some of the boundaries between each pair of the memory blocks MB1, MB2, MB3, and MB4 neighboring each other. For example, the semiconductor device may include the first impurity regions 41C disposed at the boundary between the first memory block MB1 and the second memory block MB2 and the boundary between the third memory block MB3 and the fourth memory block MB4, respectively. However, the first impurity region 41C may not be disposed at the boundary between the second memory block MB2 and the third memory block MB3.

FIGS. 5A to 8A, FIGS. 5B to 8B, and FIGS. 9 and 10 are diagrams illustrating a method of manufacturing a semiconductor device according to an embodiment. FIGS. 5A to 8A are layout views, FIGS. 5B to 8B are cross-sectional views taken along the first direction I of FIGS. 5A to 8A, and FIGS. 9 and 10 are cross sectional views. Hereinbelow, repetitive explanation will be omitted if deemed redundant.

Figure 5A:
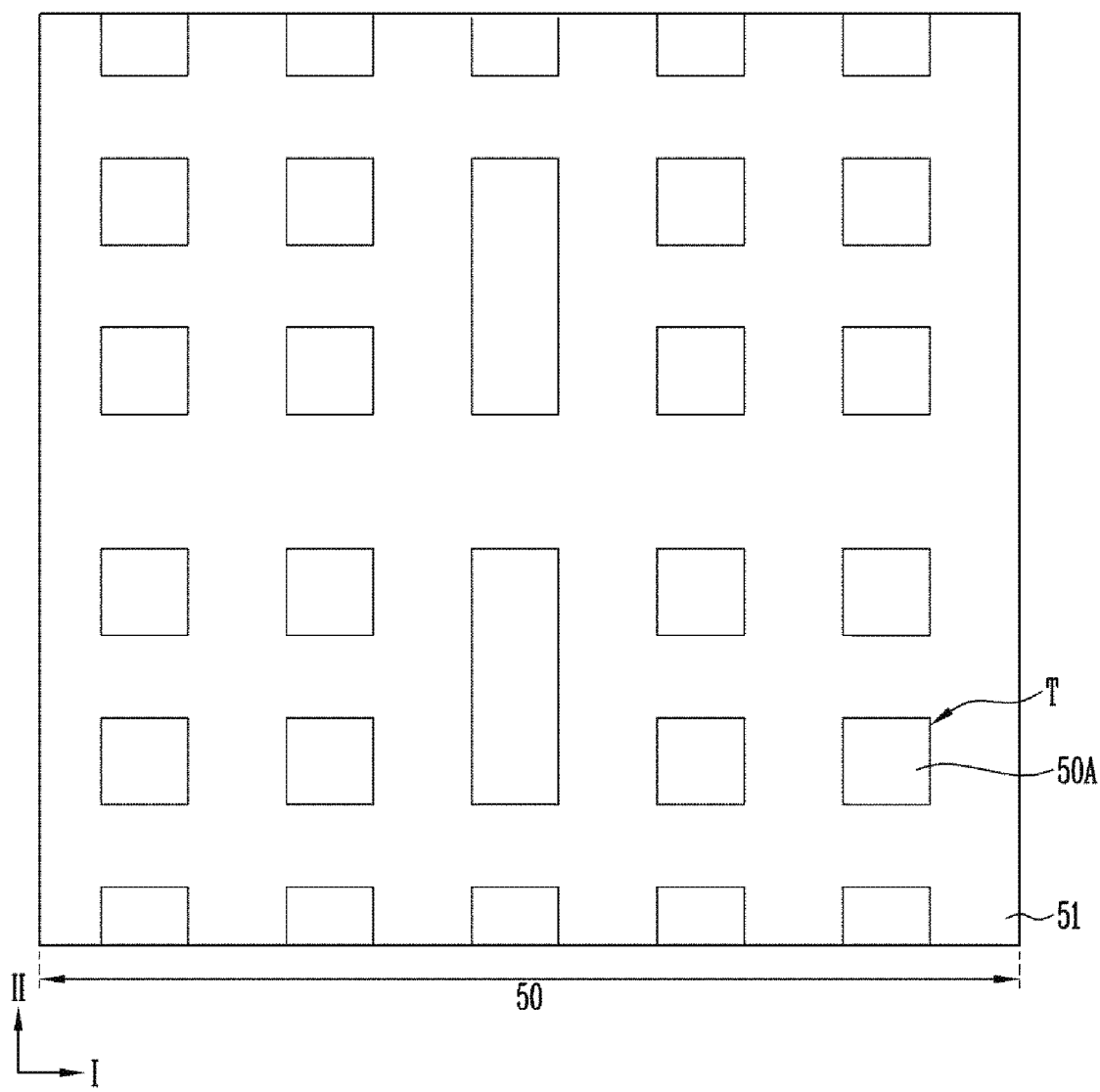
Figure 5B:
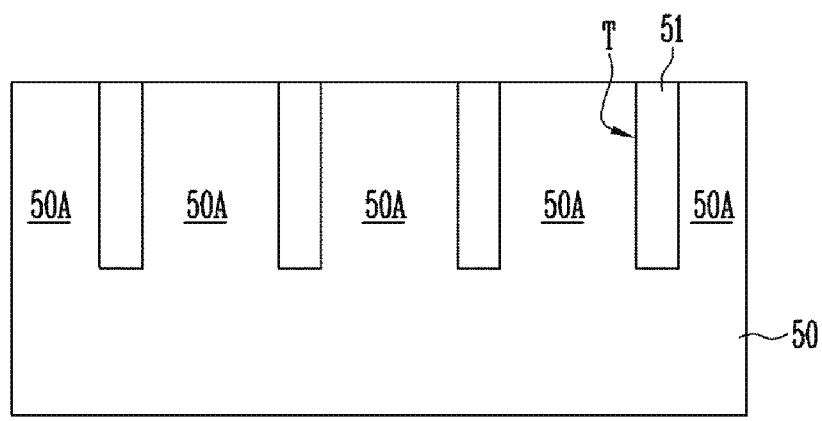

Referring to FIGS. 5A and 5B, the trench T may be formed in an isolation region of a substrate 50, and an isolation layer 51 may then be formed in the trench T. Active regions 50A may be defined by the isolation layer 51. For reference, a process of forming the isolation layer 51 may be omitted.

Figure 6B:
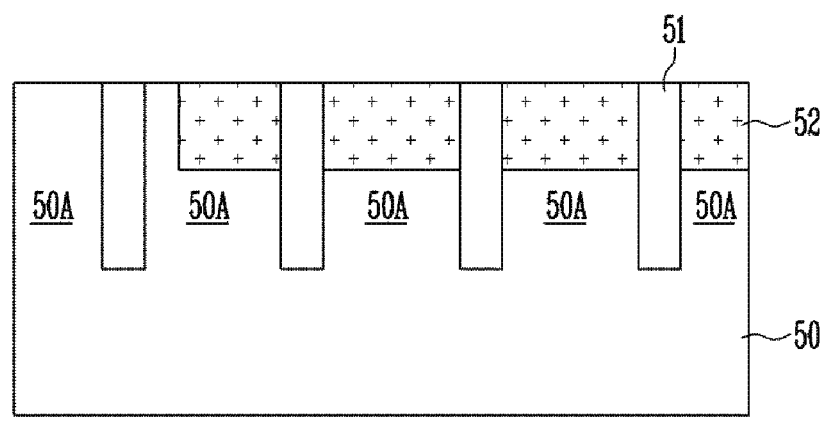

Referring to FIGS. 6A and 6B, a first impurity region 52 may be formed in the substrate 50. The first impurity regions 52 may include a first type impurity and the substrate 50 may include a second type impurity. When the substrate 50 includes the isolation layer 51, the first impurity region 52 may be formed in the active region 50A.

The first impurity region 52 may be formed by an ion injection process. For example, a first mask pattern (not illustrated) may be formed on the substrate 50, and the first impurity region 52 may then be formed by the ion injection process using the first mask pattern as a barrier. The first mask pattern may include an opening exposing a first region R1 in which the first impurity region 52 is formed. For example, the first mask pattern may cover second and third regions R2 and R3 and expose the first region R1.

A depth of the first impurity region 52 may be controlled depending on an injection depth of the impurity during the ion injection process, for example, depending on a projected range (Rp). In addition, the first impurity region 52 may have a sufficient depth so that a first opening to be formed during subsequent processes does not completely pass through the first impurity region 52. For example, the first impurity region 52 may have a smaller depth than the isolation layer 51. In this example, the first impurity region 52 may be formed only in some region of the active region 50A. For another example, the first impurity region 52 may have a larger depth than the isolation layer 51. In this example, the first impurity region 52 may be formed in the entire region of the active region 50A and the first impurity region 52 of the active regions 50A neighboring each other may be coupled to each other (please refer to FIG. 1E).

For reference, before or after forming the first impurity region 52, a second impurity region 53 may be additionally formed. For example, after forming a second mask pattern (not illustrated) on the substrate 50, the second impurity region 53 may be formed by an ion injection process using the second mask pattern as a barrier. In this example, the second mask pattern may include an opening to expose a region in which the second impurity region 53 is formed. For example, the second mask pattern may cover the first and second regions R1 and R2 and expose the third region R3. Accordingly, the second impurity region 53 may be formed only in the third region R3. In this example, the second impurity region 53 may not be formed in the vicinity of the first impurity region 52, and a PN junction may be formed at a boundary between the substrate 50 and the first impurity region 52 (please refer to FIGS. 1A, 1C, and 1E). For another example, the second mask pattern may expose the first, second, and third regions R1, R2, and R3. Accordingly, the second impurity region 53 may be formed to the first, second, and third R1, R2, and R3. In this example, the first impurity region 52 may be disposed in the second impurity region 53, and a PN junction may be formed at a boundary between the first impurity region 52 and the second impurity region 53 (please refer to FIGS. 1B and 1D).

Figure 7A:
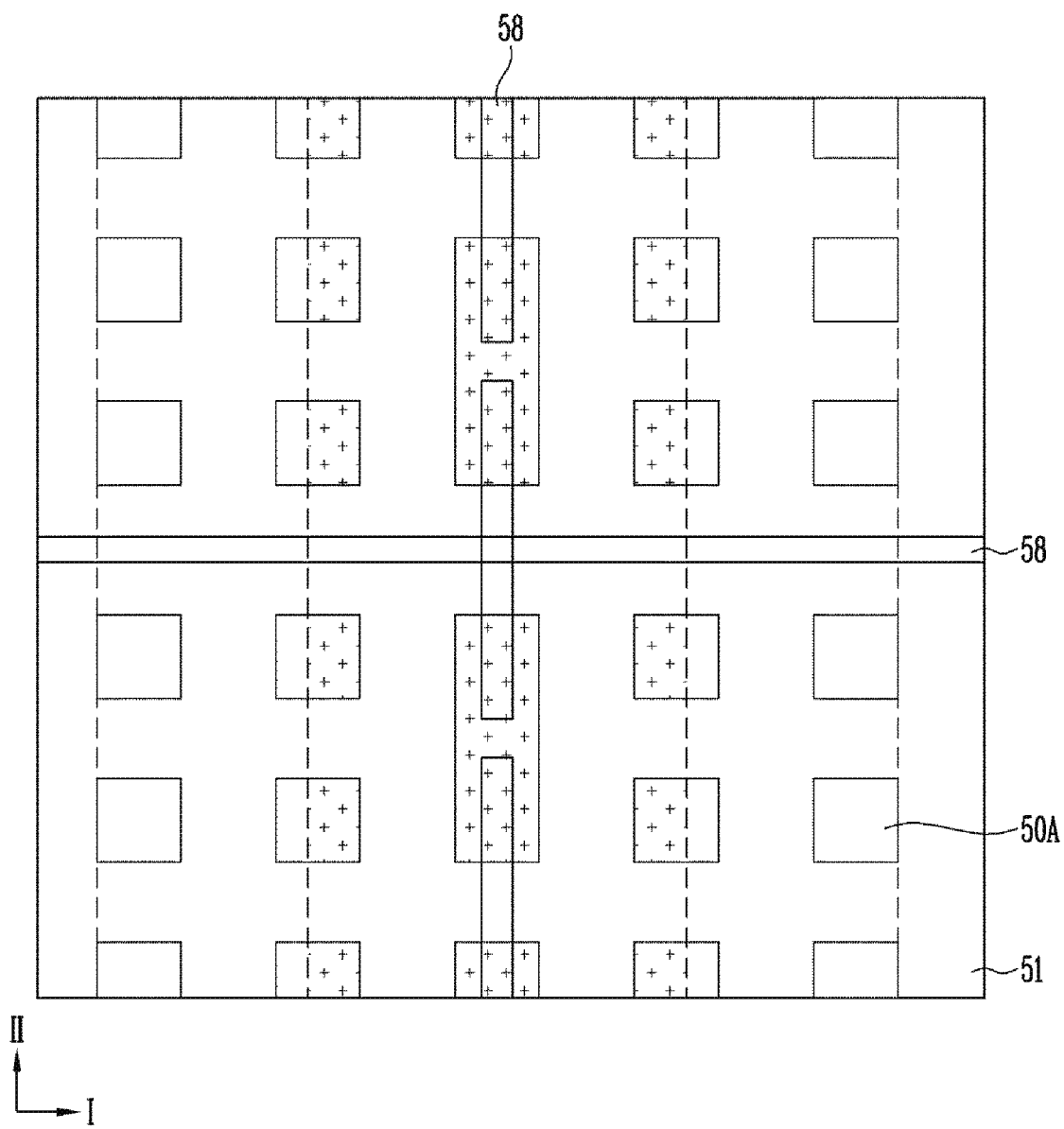
Figure 7B:
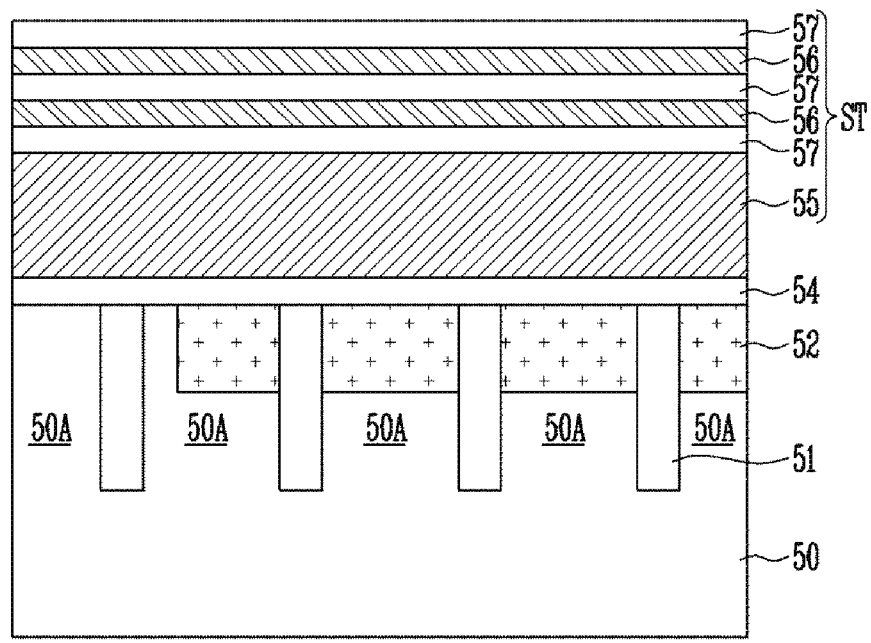

Referring to FIGS. 7A and 7B, an interlayer insulating layer 54 may be formed on the substrate 50 and a first conductive layer 55 may then be formed on the interlayer insulating layer 54. For example, the stack structure ST including the first conductive layer 55 may be formed. The first conductive layer 55 may be formed on the interlayer insulating layer 54, and first material layers 56 and second material layers 57 may be alternately formed on the first conductive layer 55. The first conductive layer 55 may include a first type impurity. For example, the first conductive layer 55 may be a polysilicon layer including an N type impurity.

The first material layers 56 may be provided to form gate electrodes of the memory cells and the select transistors. The second material layers 57 may be provided to insulate the stacked gate electrodes from each other. The first material layers 56 may include materials having high etch selectivity with respect to the second material layers 57. For example, each of the first material layers 56 may be a sacrificial layer including a nitride, etc., and each of the second material layers 57 may be an insulating layer including an oxide, etc. Alternatively, the first material layers 56 may be conductive layers including polysilicon, tungsten, or the like, and the second material layers 57 may be insulating layers including oxides or the like. In another example, each of the first material layers 56 may be a conductive layer including doped polysilicon, and each of the second material layers 57 may be a sacrificial layer including undoped polysilicon.

Though not shown in FIGS. 7A and 7B, a lower structure may be formed prior to forming the stack structure ST. For example, a peripheral circuit may be formed, or an interconnection structure including a contact plug, a wire, etc., may be formed.

Thereafter, an insulating pattern 58 passing through the stack structure ST may be formed. The insulating pattern 58 may be disposed in the memory block or at a boundary of each pair of the memory blocks neighboring each other. The insulating pattern 58 may extend in the first direction I or the second direction II.

Figure 8A:
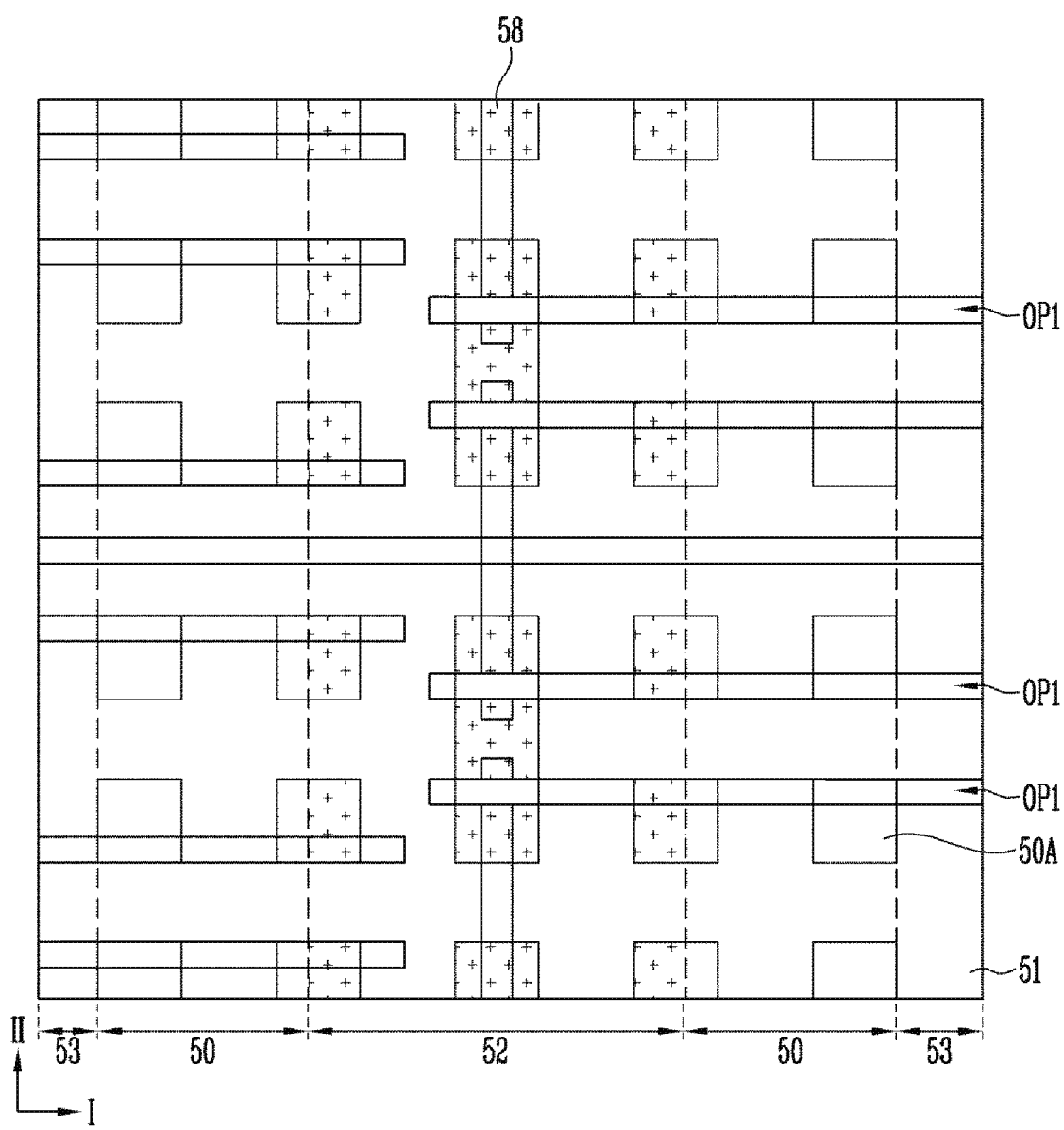
Figure 8B:
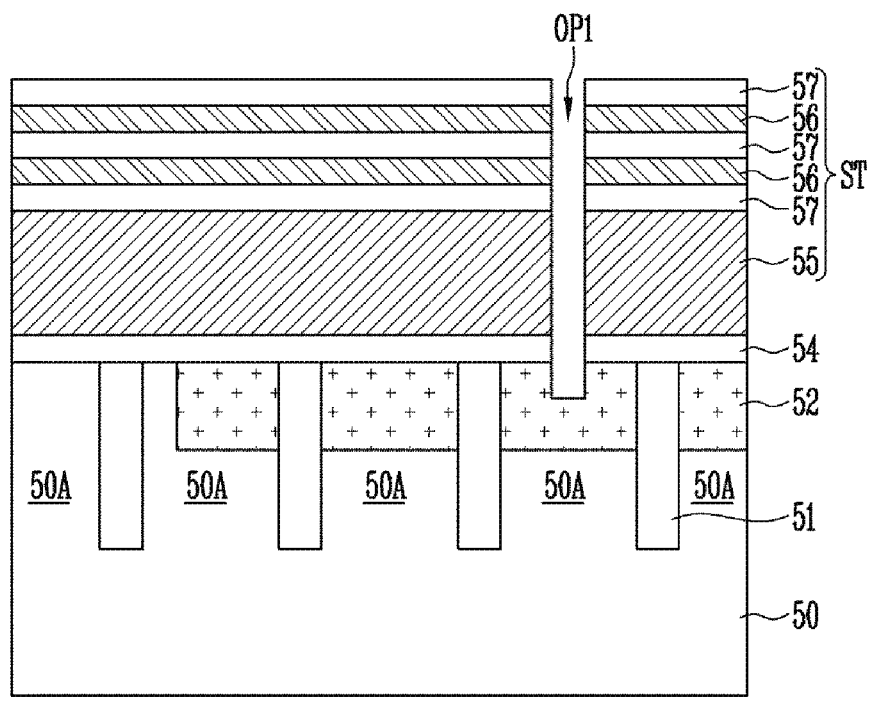

Referring to FIGS. 8A and 8B, a first opening OP1 passing through the stack structure ST may be formed. The first opening OP1 may have a depth at least to expose the interlayer insulating layer 54 and may extend downwards. For example, the first opening OP1 may have a depth to expose the first impurity region 52. In this example, a bottom surface of the first opening OP1 may be disposed on a higher level than a bottom surface of the first impurity region 52.

The first opening OP1 may intersect the insulating pattern 58. A region in the first opening OP1 which intersects the insulating pattern 58 may have high selectivity to a region which does not intersect the insulating pattern 58. Accordingly, a possibility that a punch occurs may become high in the region in the first opening OP1 which intersects the insulating pattern 58. The first impurity region 52 may be exposed in the region in the first opening OP1 which intersects the insulating pattern 58.

Figure 9:
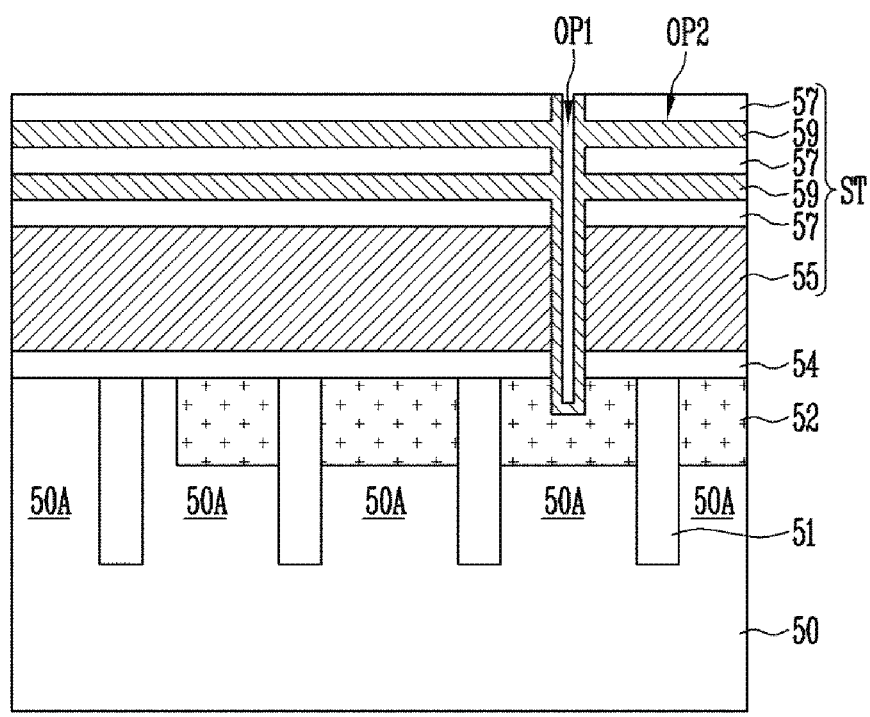

Referring to FIG. 9, the first material layers 56 may be removed through the first opening OP1. For example, second openings OP2 may be formed between the second material layers 57 by selectively etching the first material layers 56.

Thereafter, a third material layer 59 may be formed in the second openings OP2 through the first opening OP1. The third material layer 59 may fill the second openings OP2. The third material layer 59 may be formed in the first opening OP1. For example, the third material layer 59 may be a conductive layer and a metal layer including tungsten and the like.

Figure 10:
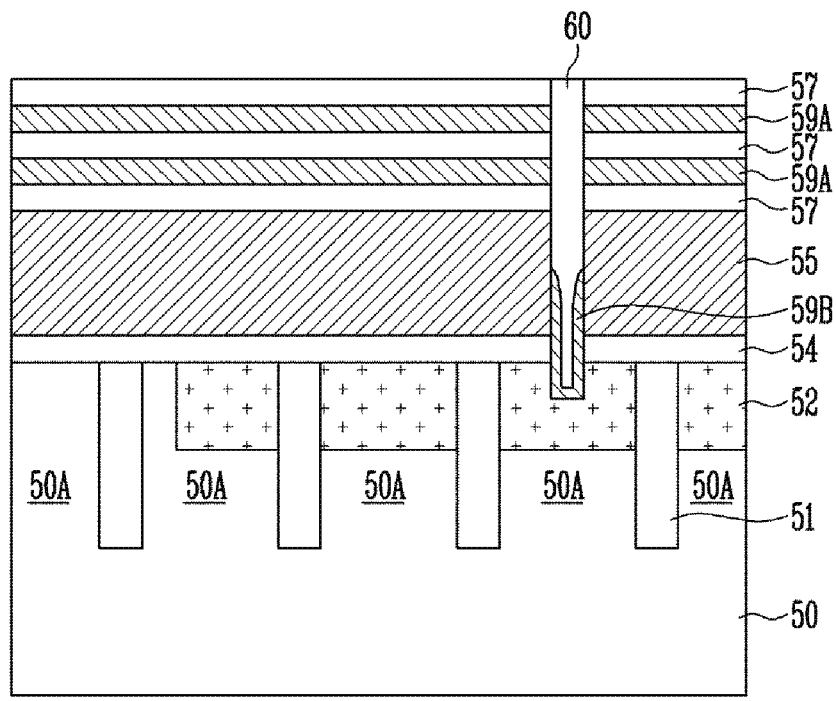

Referring to FIG. 10, the third material layer 59 may be etched to form third material patterns 59A. For example, a region in the third material layer 59 which is formed in the first opening OP1 may be etched to form the third material patterns 59A disposed in the second openings OP2, respectively. Accordingly, the third material patterns 59A which are stacked may be separated from each other. However, when the first opening OP1 has a great depth or a high aspect ratio, a third material may remain at a bottom surface of the first opening OP1. In other words, a conductive pattern 59B may remain in the first opening OP1 and the first impurity region 52 and the first conductive layer 55 may be electrically connected by the conductive pattern 59B.

Thereafter, an insulating structure 60 may be formed in the first opening OP1. The insulating structure 60 may include an insulating layer such as an oxide, a nitride, and the like.

According to the above-described manufacturing process, the first impurity region 52 may be formed under the insulating structure 60. Accordingly, even though the conductive pattern 59B remains in the first opening OP1, current loss from the first conductive layer 55 to the first impurity region 52 may be prevented.

The above-described manufacturing method may be performed by using a peripheral circuit forming process. For example, the above-described impurity injection process and the like may be performed by using a manufacturing process of a transistor to be illustrated in FIG. 11.

Figure 11:
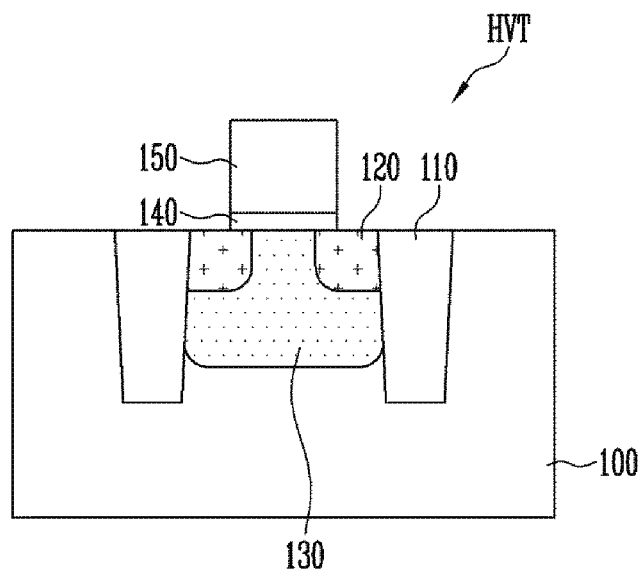
FIG. 11 is a cross-sectional view of a transistor included in a semiconductor device according to an embodiment.

Referring to FIG. 11, a transistor may include a gate insulating layer 140 and a gate electrode 150. The transistor may include a first impurity region 120, a second impurity region 130, and an isolation layer 110 formed in a substrate 100. The transistor may be a high voltage transistor HVT.

A method of forming the transistor may be schematically described as below. Firstly, the isolation layer 110 may be formed in the substrate 100, and the first impurity region 120 may be formed by selectively injecting a first type impurity into the substrate 100 using a first mask pattern. Thereafter, the second impurity region 130 may be formed by selectively injecting a second type impurity into the substrate 100 using a second mask pattern. For reference, it is possible to form the first impurity regions 120 after forming the second impurity regions 130.

Accordingly, the first impurity region 52 of FIG. 6A may be formed by using the first mask pattern and the impurity injection process for forming the first impurity regions 120. In addition, the second impurity regions 53 of FIG. 6A may be formed by using the second mask pattern and the impurity injection process for forming the second impurity regions 130. In other words, the first impurity region 52 and the second impurity regions 53 may be formed by changing a portion of a form of the existing mask without adding a mask formation process and the ion injection process.

Figure 12:
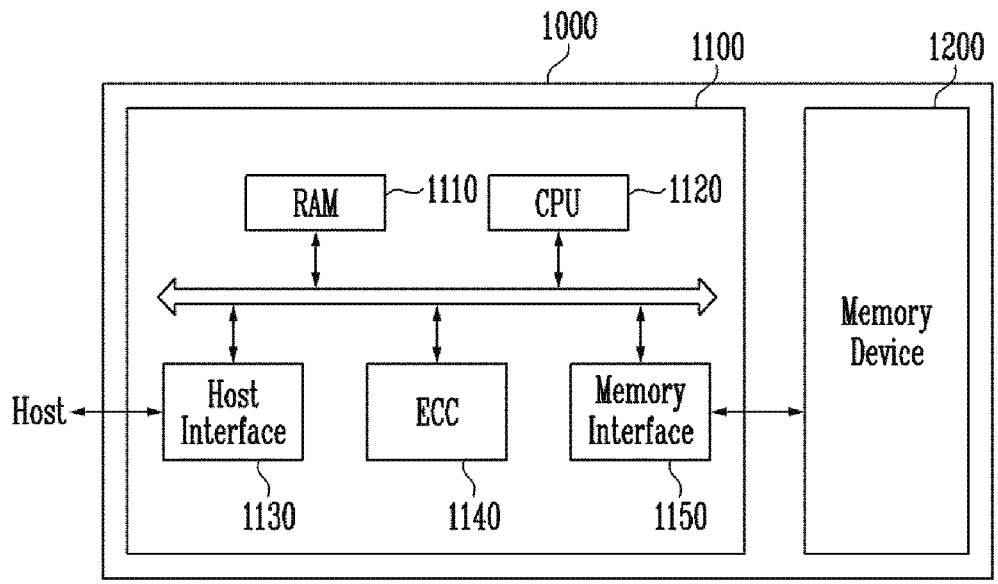
FIGS. 12 and 13 are block diagrams illustrating the configuration of a memory system according to an embodiment.

FIG. 12 is a block diagram illustrating the configuration of a memory system 1000 according to an embodiment.

As illustrated in FIG. 12, the memory system 1000 according to the embodiment may include a memory device 1200 and a controller 1100.

The memory device 1200 may be used to store data information having a variety of data forms such as text, graphics, and software codes. The memory device 1200 may be a non-volatile memory. Furthermore, the memory device 1200 may have the structure described above with reference to FIGS. 1A to 11, and may be manufactured by the manufacturing method described above with reference to FIGS. 1A to 11. As an embodiment, the memory device 1200 may include a stack structure including a first conductive layer which includes a first type impurity, a substrate disposed under the stack structure and including a second type impurity different from the first type impurity, first impurity regions disposed in the substrate and including the first type impurity, and at least one trench passing through the stack structure and disposed above the first impurity regions. The structure of the memory device 1200 and the manufacturing method thereof are the same as those described above, therefore detailed explanation thereof will be omitted.

The controller 1100 may be coupled to a host and the memory device 1200, and may access the memory device 1200 in response to a request from the host. For example, the controller 1100 may control read, write, erase, and background operations of the memory device 1200.

The controller 1100 may include Random Access Memory (RAM) 1110, a Central Processing Unit (CPU) 1120, a host interface 1130, an error correction code (ECC) circuit 1140, a memory interface 1150, and the like.

The RAM 1110 may be used as an operation memory of the CPU 1120, a cache memory between the memory device 1200 and the host, a buffer memory between the memory device 1200 and the host, and so forth. For reference, the RAM 1110 may be replaced with Static Random Access Memory (SRAM), Read Only Memory (ROM), or the like.

The CPU 1120 may control the overall operations of the controller 1100. For example, the CPU 1120 may be configured to operate firmware such as a flash translation layer (FTL) stored in the RAM 1110.

The host interface 1130 may be configured to interface with the host. For example, the controller 1100 may be configured to communicate with the host through at least one of various interface protocols such as a Universal Serial Bus (USB) protocol, a MultiMedia Card (MMC) protocol, a Peripheral Component Interconnection (PCI) protocol, a PCI-Express (PCI-E) protocol, an Advanced Technology Attachment (ATA) protocol, a Serial-ATA protocol, a Parallel-ATA protocol, a Small Computer Small Interface (SCSI) protocol, an Enhanced Small Disk Interface (ESDI) protocol, and an Integrated Drive Electronics (IDE) protocol, a private protocol, and the like.

The ECC circuit 1140 may use an error correction code (ECC) to detect and correct errors in data read from the memory device 1200.

The memory interface 1150 may be configured to interface with the memory device 1200. For example, the memory interface 1150 may include a NAND interface or a NOR interface.

For reference, the controller 1100 may further include a buffer memory (not shown) for temporarily storing data. The buffer memory may be used to temporarily store data to be transferred through the host interface 1130 to an external device or data to be transferred through the memory interface 1150 from the memory device 1200. In addition, the controller 1100 may further include a ROM that stores code data for interfacing with the host.

Since the memory system 1000 according to the embodiment includes the memory device 1200 having improved integration density and characteristics, the memory system 1000 may also have improved integration density and characteristics accordingly.

Figure 13:
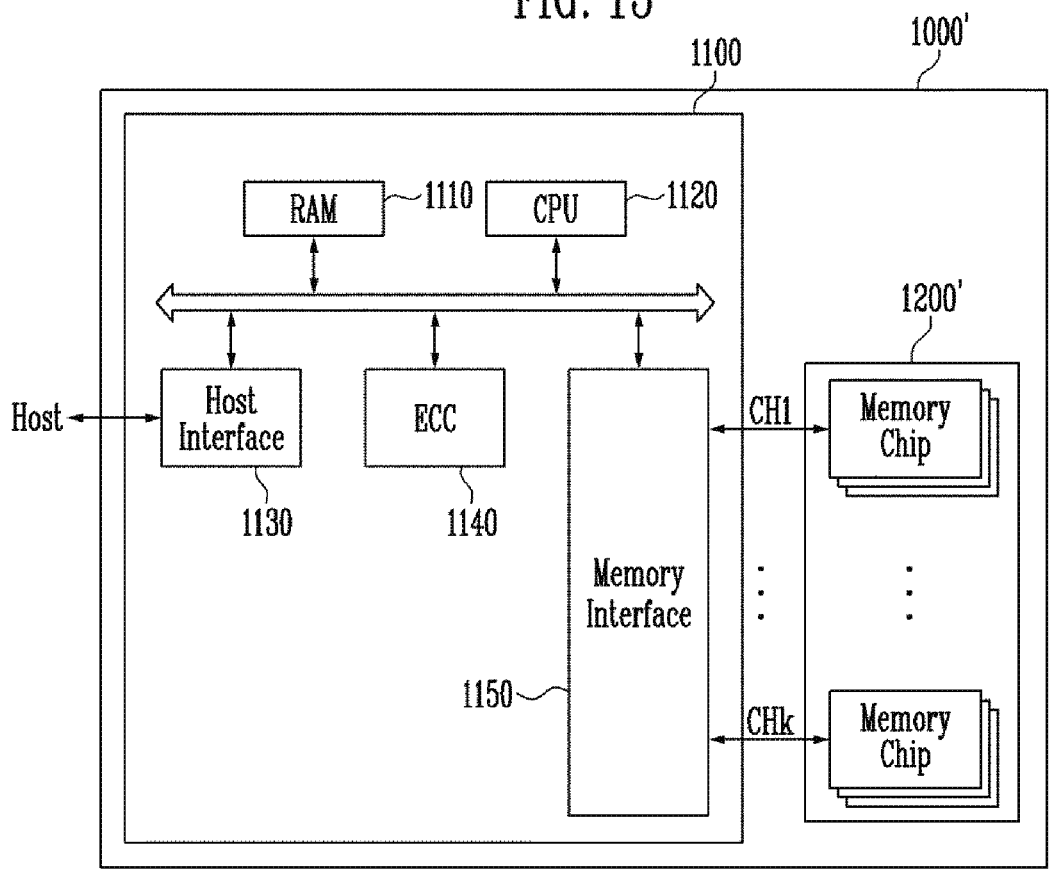

FIG. 13 is a block diagram illustrating the configuration of a memory system 1000' according to an embodiment. Hereinbelow, repetitive explanation will be omitted if deemed redundant.

Referring to FIG. 13, the memory system 1000' according to the embodiment may include a memory device 1200' and the controller 1100. The controller 1100 may include the RAM 1110, the CPU 1120, the host interface 1130, the ECC circuit 1140, the memory interface 1150, and so on.

The memory device 1200' may be a non-volatile memory. Furthermore, the memory device 1200' may have the structure described above with reference to FIGS. 1A to 11, and may be manufactured by the manufacturing method described above with reference to FIGS. 1A to 11. As an embodiment, the memory device 1200' may include stack structures including a first conductive layer which includes a first type impurity, a substrate disposed under the stack structures and including a second type impurity different from the first type impurity, first impurity regions disposed in the substrate and including the first type impurity, and at least one trench passing through the stack structures and disposed above the first impurity regions. The structure of the memory device 1200' and the manufacturing method thereof are the same as those described above, therefore detailed explanation thereof will be omitted.

Furthermore, the memory device 1200' may be a multi-chip package including a plurality of memory chips. The plurality of memory chips may be divided into a plurality of groups which may communicate with the controller 1100 through first to kth channels CH1 to CHk, respectively. In addition, memory chips, included in a single group, may be suitable for communicating with the controller 1100 through a common channel. For reference, the memory system 1000' may be modified such that each single memory chip is coupled to a corresponding single channel.

Since the memory system 1000' according to the embodiment includes the memory device 1200' having improved integration density and characteristics, integration density and characteristics of the memory system 1000' may also be improved. In addition, since the memory device 1200' is formed using a multi-chip package, data storage capacity and driving speed of the memory system 1000' may be further increased.

Figure 14:
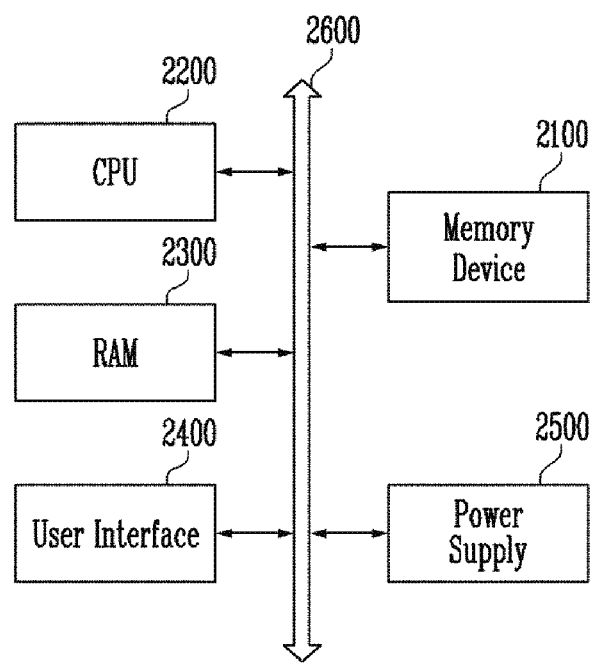
FIGS. 14 and 15 are block diagrams illustrating the configuration of a computing system according to an embodiment.

FIG. 14 is a block diagram illustrating the configuration of a computing system 2000 according to an embodiment. Hereinbelow, repetitive explanation will be omitted if deemed redundant.

Referring to FIG. 14, the computing system 2000 according to an embodiment includes a memory device 2100, a CPU 2200, RAM 2300, a user interface 2400, a power supply 2500, a system bus 2600, and so forth.

The memory device 2100 may store data provided via the user interface 2400, data processed by the CPU 2200, etc. Furthermore, the memory device 2100 may be electrically coupled to the CPU 2200, the RAM 2300, the user interface 2400, the power supply 2500, etc., by the system bus 2600. For example, the memory device 2100 may be coupled to the system bus 2600 via a controller (not shown) or, alternatively, directly coupled to the system bus 2600. In the case where the memory device 2100 is directly coupled to the system bus 2600, the function of the controller may be performed by the CPU 2200, the RAM 2300, etc.

The memory device 2100 may be a non-volatile memory. Furthermore, the memory device 2100 may have the structure described above with reference to FIGS. 1A to 11, and may be manufactured by the manufacturing method described above with reference to FIGS. 1A to 11. As an embodiment, the memory device 2100 may include stack structures including a first conductive layer which includes a first type impurity, a substrate disposed under the stack structures and including a second type impurity different from the first type impurity, first impurity regions disposed in the substrate and including the first type impurity, and at least one trench passing through the stack structures and disposed above the first impurity regions. Since the memory device 2100 is configured and manufactured in the same manner as the memory devices 1200 and 1200', a detailed description thereof will be omitted.

As described above with reference to FIG. 13, the memory device 2100 may be a multi-chip package configured with a plurality of memory chips.

The computing system 2000 having the above-mentioned configuration may be provided as one of various electronic devices such as a computer, an Ultra Mobile PC (UMPC), a workstation, a net-book, a Personal Digital Assistant (PDA), a portable computer, a web tablet, a wireless phone, a mobile phone, a smart phone, an e-book, a Portable Multimedia Player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various electronic devices for forming a home network, one of various electronic devices for forming a computer network, one of various electronic devices for forming a telematics network, an RFID device, or the like.

As described above, since the computing system 2000 according to the embodiment includes the memory device 2100 having improved integration density and characteristics, characteristics of the computing system 2000 may also be improved.

Figure 15:
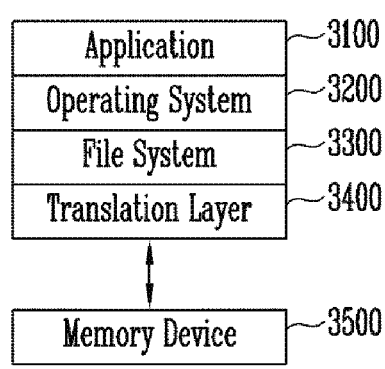

FIG. 15 is a block diagram illustrating a computing system 3000 according to an embodiment.

Referring to FIG. 15, the computing system 3000 according to the embodiment may include a software layer which has an operating system 3200, an application 3100, a file system 3300, a translation layer 3400, and so forth. Furthermore, the computing system 3000 may include a hardware layer such as a memory device 3500.

The operating system 3200 may manage software and hardware resources of the computing system 3000. The operating system 3200 may control program execution of a central processing unit. The application 3100 may include various application programs executed by the computing system 3000. The application 3100 may be a utility executed by the operating system 3200.

The file system 3300 may refer to a logical structure configured to manage data and files present in the computing system 3000. The file system 3300 may organize files or data to be stored in the memory device 3500 according to given rules. The file system 3300 may be determined depending on the operating system 3200 used in the computing system 3000. For example, if the operating system 3200 is Microsoft's Windows system, the file system 3300 may be a File Allocation Table (FAT), an NT file system (NTFS), or the like. If the operating system 3200 is a Unix/Linux system, the file system 3300 may be an extended file system (EXT), a Unix File System (UFS), a Journaling File System (JFS), or the like.

FIG. 15 illustrates the operating system 3200, the application 3100, and the file system 3300 in separate blocks. However, the application 3100 and the file system 3300 may be included in the operating system 3200.

The translation layer 3400 may translate an address so as to be suitable for the memory device 3500 in response to a request from the file system 3300. For example, the translation layer 3400 may translate a logical address produced by the file system 3300 into a physical address of the memory device 3500. Mapping information of the logical address and the physical address may be stored in an address translation table. For example, the translation layer 3400 may be a flash translation layer (FTL), a universal flash storage link layer (ULL), or the like.

The memory device 3500 may be a non-volatile memory. Furthermore, the memory device 3500 may have the structure described above with reference to FIGS. 1A to 11, and may be manufactured by the manufacturing method described above with reference to FIGS. 1A to 11. As an embodiment, the memory device 3500 may include stack structures including a first conductive layer which includes a first type impurity, a substrate disposed under the stack structures and including a second type impurity different from the first type impurity, first impurity regions disposed in the substrate and including the first type impurity, and at least one trench passing through the stack structures and disposed above the first impurity regions. Since the memory device 3500 is configured and manufactured in the same manner as described above, a detailed description thereof will be omitted.

The computing system 3000 having the above-mentioned configuration may be divided into an operating system layer implemented in an upper level region and a controller layer implemented in a lower level region. The application 3100, the operating system 3200, and the file system 3300 may be included in the operating system layer, and may be driven by an operating memory of the computing system 3000. In addition, the translation layer 3400 may be included in the operating system layer or the controller layer.

As described above, since the computing system 3000 according to the embodiment includes the memory device 3500 having improved integration density and characteristics, characteristics of the computing system 3000 may also be improved.

In accordance with various embodiments, a semiconductor device having a stabilized structure and improved reliability may be provided. In addition, a process of manufacturing a semiconductor device may be simplified with lower manufacturing costs.

Examples of embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in forms and details may be made without departing from the spirit and scope as set forth in the following claims.

What is claimed is:

1. A method of manufacturing a semiconductor device, the method comprising:
   forming a first impurity region of a first type impurity in a substrate;
   forming a stack structure including a first conductive layer including the first type impurity on the substrate;
   forming a first opening passing through the stack structure and disposed above the first impurity region; and
   forming an insulating structure in the first opening,
   wherein the substrate includes a second type impurity different from the first type impurity.

2. The method of claim 1, wherein a PN junction is formed at a boundary between the substrate and the first impurity region.

3. The method of claim 1, further comprising forming a second impurity region including the second type impurity in the substrate.

4. The method of claim 3, wherein the first impurity region is disposed in the second impurity region, and a PN junction is formed at a boundary between the second impurity region and the first impurity region.

5. The method of claim 1, further comprising forming an isolation layer in the substrate,
wherein the first impurity region is disposed in an active region defined by the isolation layer.

6. The method of claim 1, wherein the forming of the stack structure comprises:
forming the first conductive layer; and
forming first material layers and second material layers alternately on the first conductive layer.

7. The method of claim 6, further comprising:
forming second openings by removing the first material layers through the first opening;
forming a third material layer to fill the second openings; and
forming third patterns respectively disposed in the second openings by etching the third material layer.

8. The method of claim 7, wherein the third material layer partially remains at a bottom surface of the first opening during the etching of the third material layer.

9. The method of claim 8, wherein at least one third pattern and the first impurity region are electrically connected by a remaining portion of the third material layer.

10. The method of claim 1, wherein the first impurity region is formed when an impurity region of a high voltage transistor is formed.

11. A method of manufacturing a semiconductor device, the method comprising:
forming a first impurity region of a first type impurity in a substrate;
forming a first conductive layer including the first type impurity on the substrate;
forming a stack structure including first material layers and second material layers disposed on the first conductive layer and alternately stacked on each other;
forming a first opening passing through the stack structure and disposed above the first impurity region; and
replacing the first material layers with third material patterns through the first opening,
wherein the substrate includes a second type impurity different from the first type impurity, and at least one third material pattern and the first impurity region are electrically connected.

12. The method of claim 11, wherein a PN junction is formed at a boundary between the substrate and the first impurity region.

13. The method of claim 11, wherein a depletion region is formed at a boundary between the substrate and the first impurity region, and a flow of a current from the first conductive layer to the substrate is blocked by the depletion region.

14. A method of manufacturing a semiconductor device, the method comprising:
forming a first impurity region of a first type impurity in a substrate;
forming a stack structure including first material layers and second material layers alternately stacked on each other;
forming a first opening passing through the stack structure and exposing the first impurity region; and
forming a conductive pattern in contact with the first impurity region and material patterns between the second material layers,
wherein the forming of the conductive pattern and the material patterns comprises:
removing the first material layers to form second openings between the second material layers;
forming a third material layer in the first opening and the second openings; and
etching a region of the third material layer which is formed in the first opening, and
wherein the conductive pattern is a portion of the third material layer remaining in the first opening after the etching of the region of the third material layer.

15. The method of claim 14, wherein the substrate includes a second type impurity different from the first type impurity.

16. The method of claim 14, wherein the conductive pattern and the material patterns comprise the same material.

17. The method of claim 14, wherein a PN junction is formed at a boundary between the substrate and the first impurity region.

18. The method of claim 14, wherein a bottom surface of the first opening is disposed at a lower level than a top surface of the first impurity region.

19. The method of claim 14, further comprising forming an insulating structure on the conductive pattern.

20. The method of claim 14, wherein the stack structure further includes a conductive layer including the first type impurity and in contact with the conductive pattern.

* * * * *